United States Patent
Sanduleanu et al.

(10) Patent No.: US 8,350,738 B2
(45) Date of Patent: Jan. 8, 2013

(54) TRACK AND HOLD AMPLIFIERS AND DIGITAL CALIBRATION FOR ANALOG-TO-DIGITAL CONVERTERS

(75) Inventors: Mihai Adrian Tiberiu Sanduleanu, Yorktown Heights, NY (US); Jean-Olivier Plouchart, New York, NY (US); Zeynep Toprak Deniz, Glen Oaks, NY (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 13/010,285

(22) Filed: Jan. 20, 2011

(65) Prior Publication Data

US 2012/0188109 A1 Jul. 26, 2012

(51) Int. Cl.
H03M 1/10 (2006.01)

(52) U.S. Cl. .......................................... 341/120; 327/96

(58) Field of Classification Search .................. 341/120, 341/122, 155, 172; 327/96, 94, 90, 91, 95, 327/306, 309

See application file for complete search history.

(56) References Cited

U.S. PATENT DOCUMENTS

| | | | |
|---|---|---|---|
| 3,946,328 A | 3/1976 | Boctor | |
| 4,095,218 A | 6/1978 | Crouse | |
| 4,952,891 A | 8/1990 | Moulding | |
| 5,036,219 A | 7/1991 | Dingwall et al. | |
| 5,130,572 A * | 7/1992 | Stitt et al. | 327/96 |
| 5,298,801 A | 3/1994 | Vorenkamp et al. | |
| 5,389,929 A | 2/1995 | Nayebi et al. | |
| 5,517,141 A | 5/1996 | Abdi et al. | |

(Continued)

FOREIGN PATENT DOCUMENTS

WO 2004066487 A2 8/2004

(Continued)

OTHER PUBLICATIONS

K.Y. Leung et al., "A Dual Low Power ½ LSB INL 16b/1 Msample/s SAR A/D Converter with On-Chip Microcontroller," IEEE Asian Solid-State Circuits Conference, Nov. 2006, pp. 51-54.

(Continued)

Primary Examiner — Joseph Lauture
(74) Attorney, Agent, or Firm — Anne V. Dougherty; Ryan, Mason & Lewis, LLP

(57) ABSTRACT

An exemplary differential track and hold amplifier includes a track stage including first and second linearized pairs connected in series at their respective inputs and in parallel at their respective outputs. The differential track and hold amplifier also includes a hold stage selectively coupled to the outputs of the first and second linearized pairs. The hold stage includes a unity gain buffer with feedback having a hold capacitor interconnected across its outputs. The differential track and hold amplifier also includes an output buffer coupled to the outputs of the hold stage. An exemplary analog-to-digital converter includes a differential track-and-hold amplifier, a voltage ladder, and a plurality of slices. Each of the slices in turn includes a differential preamplifier coupled to the track-and-hold amplifier and to a corresponding location on the voltage ladder; a current mode logic latch comparator coupled to the differential preamplifier; a large-swing latch coupled to the current mode logic latch comparator; a complementary metal oxide semiconductor latch having a dummy load; a calibration digital to analog converter connected across outputs of the differential preamplifier to inject calibration currents; and a register coupled to the calibration digital to analog converter and storing calibration values for use thereby. The analog-to-digital converter also includes a multiplexer which multiplexes outputs of the complementary metal oxide semiconductor latches down to a predetermined number of outputs.

16 Claims, 46 Drawing Sheets

U.S. PATENT DOCUMENTS

| | | | |
|---|---|---|---|
| 5,673,047 | A | 9/1997 | Moreland |
| 5,736,878 | A | 4/1998 | McLeod |
| 6,011,431 | A | 1/2000 | Gilbert |
| 6,037,891 | A | 3/2000 | Griph |
| 6,094,093 | A | 7/2000 | Karanicolas |
| 6,307,443 | B1 | 10/2001 | Gabara |
| 6,480,133 | B2 | 11/2002 | Kobayashi et al. |
| 6,657,488 | B1 | 12/2003 | King et al. |
| 6,731,155 | B2 | 5/2004 | Hakkarainen et al. |
| 6,778,023 | B2 | 8/2004 | Christensen |
| 6,798,726 | B2 | 9/2004 | Redman-White et al. |
| 6,803,813 | B1 | 10/2004 | Pham |
| 6,831,584 | B2 | 12/2004 | Jiang et al. |
| 6,930,565 | B1 | 8/2005 | Vishinsky |
| 7,136,000 | B1 | 11/2006 | Hidri et al. |
| 7,148,828 | B2 | 12/2006 | Fernandez et al. |
| 7,154,306 | B2 | 12/2006 | Wuppermann |
| 7,400,212 | B1 | 7/2008 | Vishinsky |
| 7,492,242 | B2 | 2/2009 | Carpenter |
| 7,528,752 | B1 | 5/2009 | Chern |
| 7,545,235 | B2 | 6/2009 | Mansour et al. |
| 2006/0001455 | A1 | 1/2006 | Wuppermann |
| 2006/0049857 | A1 | 3/2006 | Song |
| 2006/0125531 | A1 | 6/2006 | Romero et al. |
| 2006/0152251 | A1 | 7/2006 | Setterberg |
| 2006/0192546 | A1 | 8/2006 | Geelen |
| 2007/0008030 | A1 | 1/2007 | Kasperkovitz |
| 2007/0152863 | A1 | 7/2007 | Le et al. |
| 2008/0150772 | A1 | 6/2008 | Cao et al. |
| 2009/0015329 | A1 | 1/2009 | Chatterjee et al. |
| 2009/0039923 | A1 | 2/2009 | Corsi et al. |
| 2009/0066555 | A1 | 3/2009 | Van Der Plas et al. |
| 2009/0072868 | A1 | 3/2009 | Choi et al. |
| 2009/0278625 | A1 | 11/2009 | Chen et al. |
| 2010/0022215 | A1 | 1/2010 | Ganger et al. |

FOREIGN PATENT DOCUMENTS

| | | |
|---|---|---|
| WO | 2005013284 A1 | 2/2005 |
| WO | 2009034518 A2 | 3/2009 |

OTHER PUBLICATIONS

M.P. Flynn et al., "Digital Calibration Incorporating Redundancy of Flash ADCs," IEEE Transactions on Circuits and Systems—II: Analog and Digital Signal Processing, May 2003, pp. 205-213, vol. 50, No. 5.

M. Wang et al., "Low-Power 4-b 2.5-GSPS Pipelined Flash Analog-to-Digital Converter in 130-nm CMOS," IEEE Transactions on Instrumentation and Measurement, Jun. 2007, pp. 1064-1073, vol. 56, No. 3.

Andrew N. Karanicolas, "A 2.7-V 300-MS/s Track-and-Hold Amplifier," IEEE Journal of Solid-State Circuits, Dec. 1997, pp. 1961-1967, vol. 32, No. 12.

S. Shahramian et al., "A 40-G samples/sec Track & Hold Amplifier in 0.18 μm SiGe BiCMOS Technology," IEEE Compound Semiconductor Integrated Circuit Symposium, Oct.-Nov. 2005, pp. 101-104.

A.M. Abo et al., "A 1.5-V, 10-Bit, 14.3-MS/s CMOS Pipeline Analog-to-Digital Converter," IEEE Journal of Solid-State Circuits, May 1999, pp. 599-606, vol. 34, No. 5.

J. Steensgaard, "Bootstrapped Low-Voltage Analog Switches," IEEE International Symposium on Circuits and Systems, Jul. 1999, pp. 29-32, vol. 2.

H. Pan et al., "A 3.3-V 12-b 50-MS/s A/D Converter in 0.6-μm CMOS with Over 80-dB SFDR," IEEE Journal of Solid-State Circuits, Dec. 2000, pp. 1769-1780, vol. 35, No. 12.

M. Dessouky et al., "Very Low-Voltage Digital-Audio ΔΣ Modulator with 88-dB Dynamic Range Using Local Switch Bootstrapping," Mar. 2001, pp. 349-355, vol. 36, No. 3.

Ron Tipton, "All About Electronically-Tunable Active Filters," Poptronics, Aug. 2000, pp. 42-50.

A. Papoulis, "Optimum Filters with Monotonic Response," Proceedings of the IRE, Mar. 1958, pp. 606-609, vol. 46, No. 3.

A. Papoulis, "On Monotonic Response Filters," Proceedings of the IRE, Feb. 1959, pp. 332-333, vol. 47.

U.S. Appl. No. 13/010,249, filed in the name of M.A.T. Sanduleanu et al. on Jan. 20, 2011 and entitled "Self Calibrated, Broadband, Tunable, Active Filter with Unity Gain Cells for Multi-Standard and/or Multiband Channel Selection."

* cited by examiner

FIG. 46

| INPUT COMMON MODE | 0.185V |
|---|---|
| INPUT SIGNAL AMPLITUDE | 0.5 TO 1Vpp, DIFF |
| 3-dB BANDWIDTH T/H | 5.4GHz |
| HD2, HD3 T/H | <50.8dBc |
| TOTAL MACRO POWER @ VDD=1V, VDDA=1.2V | 123mW |
| ADC POWER WITHOUT I/Os | 94mW |
| ADC FOM AT Fs=2.592 GHz | 401fJ/CONV FOR 6.5b ENOB |

TRACK AND HOLD AMPLIFIERS AND DIGITAL CALIBRATION FOR ANALOG-TO-DIGITAL CONVERTERS

CROSS REFERENCE TO RELATED APPLICATION

The present application is related to the U.S. patent application identified as Ser. No. 13/010,249, entitled "Self Calibrated, Broadband, Tunable, Active Filter with Unity Gain Cells for Multi-Standard and/or Multiband Channel Selection," filed concurrently herewith, the disclosure of which is incorporated by reference herein in its entirety.

FIELD OF THE INVENTION

The present invention generally relates to electronic circuitry, and, more particularly, to analog-to-digital (A/D) conversion and the like.

BACKGROUND OF THE INVENTION

The track and hold amplifier (TH or T/H) is the first amplifier in an A/D converter chain. Since the introduction of the first monolithic T/H amplifier in 1974, different architectures have been proposed and different circuit techniques have been employed to reduce the pedestal error without sacrificing speed and linearity of the system. For low speed A/D converters, closed loop techniques can improve the accuracy of the T/H by sacrificing speed. New applications like mm-wave wireless communications at 60 GHz, cognitive radios and cable television require a broadband A/D converter with bandwidths in excess of 850 MHz and moderate accuracy (7-10 bits) for digitizing the intermediate frequency (IF) signal and/or direct sampling. For these applications, open-loop T/H amplifiers can be used. However, the techniques introduced recently cannot necessarily be classified in the open loop or closed loop categories, as open loop circuit topologies can employ local feedback paths. Most of the techniques introduced in bipolar technologies, working at supply voltages in the order of 2.5-2.7V, cannot be transferred directly in modern CMOS processes as operation at about 1V is key for low power in digital.

U.S. Patent Publication 2009/0039923 discloses a track-and-hold circuit with low distortion; in particular, a track-and-hold circuit capable of tracking an analog input signal and holding a sampled voltage of the analog input signal at a sampling instant for processing by other circuitry, in response to a track signal that alternates with a hold signal. A first capacitor is provided, having a first terminal connected to a power supply terminal. Tracking circuitry operates when in an on state to apply through a resistor a tracking voltage to a second terminal of the first capacitor that corresponds to the voltage of the analog input signal, by applying the tracking voltage to a first terminal of the resistor, the second terminal of the resistor being connected to the second terminal of the first capacitor. A switch, responsive to the track signal and the hold signal, operates to switch the tracking circuitry to an on state in response to the track signal and to an off state in response to the hold signal, the time of change from the track signal to the hold signal comprising the sampling instant. A second capacitor is provided, having a first terminal connected to the first terminal of the resistor and having a second terminal connected to a power supply terminal. The second capacitor substantially reduces frequency-dependent harmonic distortion.

U.S. Patent Publication 2009/0072868 discloses a wideband track-and-hold amplifier which is provided in front of an analog-to-digital converter, receives and samples an analog signal, and transfers the sampled signal to the analog-to-digital converter, wherein an output load unit having an inductance component is connected to an input terminal of the analog-to-digital converter. Therefore, it is possible to compensate for a high capacitance component of an analog-to-digital converter, to increase the bandwidth of an output signal, and to improve system linearity.

U.S. Patent Publication 2007/0152863 discloses a digital calibration loop for an analog to digital converter; in particular, a method and apparatus to counter effects of an offset voltage by calibrating an analog-to-digital converter (ADC). A digital calibration loop minimizes the effects of offset voltage to improve ADC accuracy as well as provide a low-power, submicron-scale ADC. A calibration circuit senses an ADC output and adjusts a variable calibration voltage to counter the effects of the offset voltage. Reduction of the offset voltage effects increases the ADC accuracy.

SUMMARY OF THE INVENTION

Principles of the present invention provide techniques for track and hold amplifiers and digital calibration for analog-to-digital converters.

In an exemplary embodiment, according to one aspect of the invention, an exemplary differential track and hold amplifier includes a track stage including first and second linearized pairs connected in series at their respective inputs and in parallel at their respective outputs. The differential track and hold amplifier also includes a hold stage selectively coupled to the outputs of the first and second linearized pairs. The hold stage includes a unity gain buffer with feedback having a hold capacitor interconnected across its outputs. The differential track and hold amplifier also includes an output buffer coupled to the outputs of the hold stage.

In another exemplary embodiment, according to another aspect of the invention, an exemplary analog-to-digital converter includes a differential track-and-hold amplifier, a voltage ladder, and a plurality of slices. Each of the slices in turn includes a differential preamplifier coupled to the track-and-hold amplifier and to a corresponding location on the voltage ladder; a current mode logic latch comparator coupled to the differential preamplifier; a large-swing latch coupled to the current mode logic latch comparator; a complementary metal oxide semiconductor latch having a dummy load; a calibration digital to analog converter connected across outputs of the differential preamplifier to inject calibration currents; and a register coupled to the calibration digital to analog converter and storing calibration values for use thereby. The analog-to-digital converter also includes a multiplexer which multiplexes outputs of the complementary metal oxide semiconductor latches down to a predetermined number of outputs.

These and other objects, features and advantages of the present invention will become apparent from the following detailed description of illustrative embodiments thereof, which is to be read in connection with the accompanying drawings.

BRIEF DESCRIPTION OF THE DRAWINGS

FIG. 46 shows a summary of the exemplary seven-bit binary weighted D/A, according to an aspect of the invention;

DETAILED DESCRIPTION OF PREFERRED EMBODIMENTS

Figure 1:
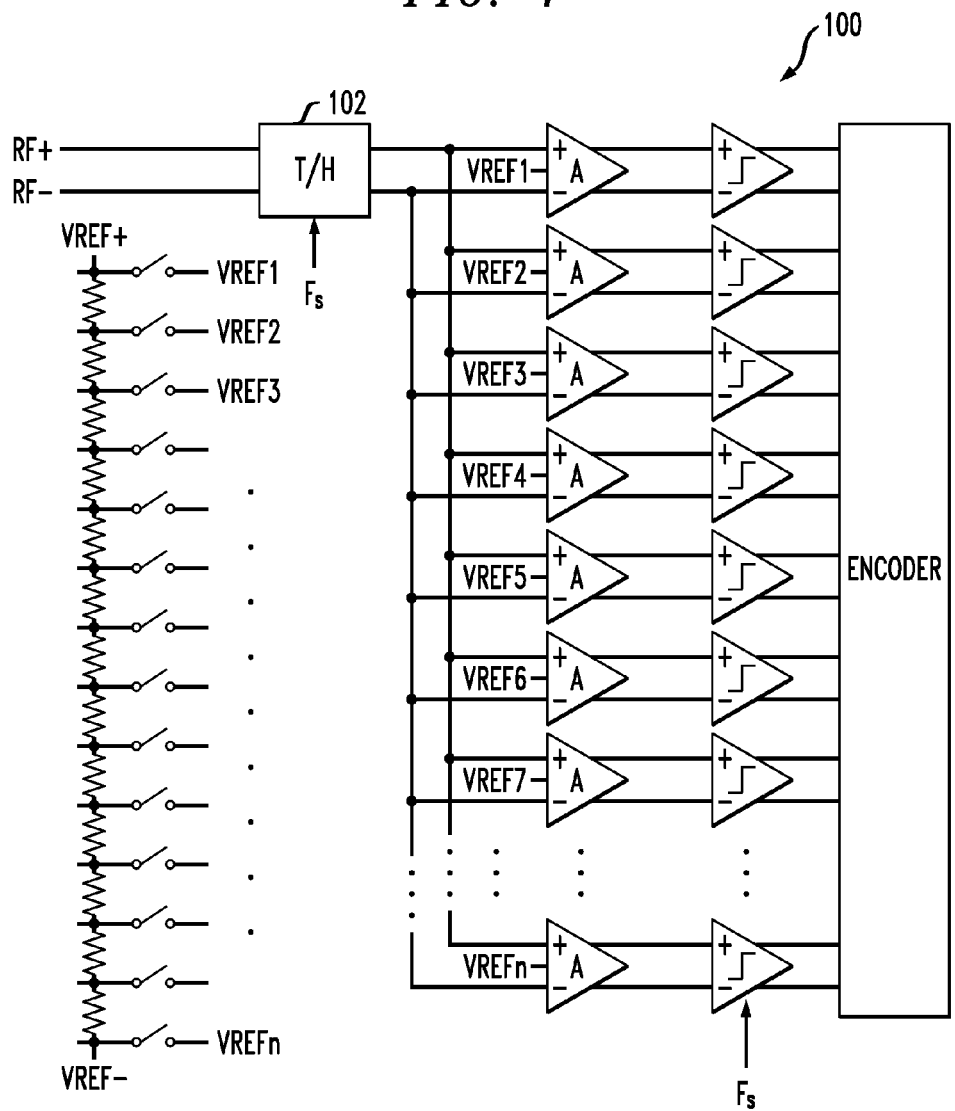
FIG. 1 shows an exemplary differential T/H in a flash analog-to-digital converter (ADC)

Reference should now be had to FIG. 1, which shows a high-speed flash A/D converter 100 with one T/H amplifier 102 sampling a differential RF signal (RF+ and RF−). The advantage of having one high-speed T/H amplifier in front of the A/D resides in the reduction of the sampling time uncertainty effects and mitigation of the problems related to skew between signal and sampling clock present when using one T/H per slice. The sampling time uncertainty ($\Delta t = 2^{-N}/\pi f_{in}$) for an A/D converter with 1 GHz input signal and 7 bits resolution is in the order of 2.5 ps. A differential solution will be more robust and less susceptible to common-mode noise. Besides, the SNDR of the T/H amplifier will be dominated by odd order distortion components and not by even order distortion components.

Figure 2:
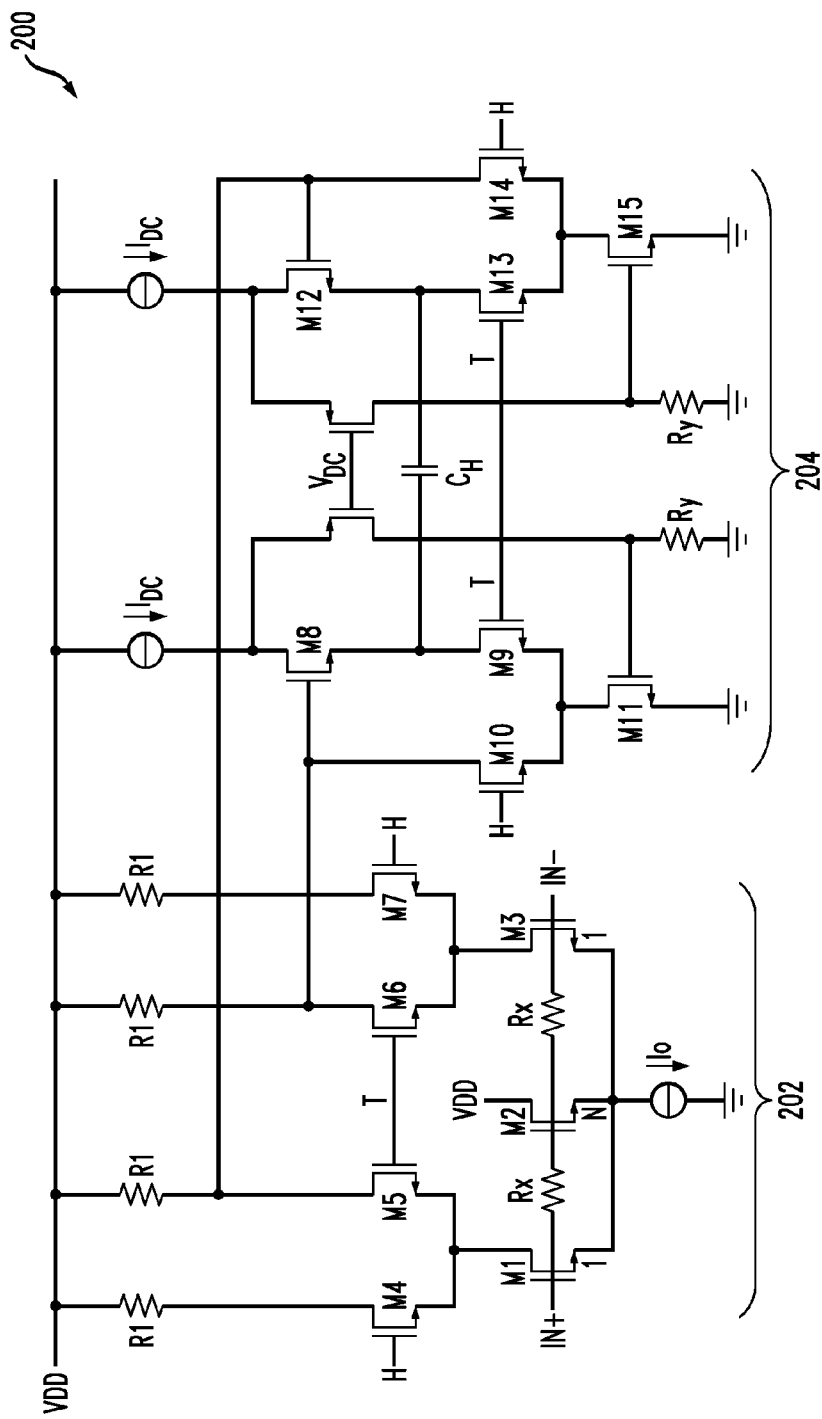
FIG. 2 shows an exemplary differential T/H with a differential sampling capacitor, according to an aspect of the invention.

It should be noted that, advantageously, one or more embodiments of the invention provide one or more of the following advantages:

A/D can achieve good resolution
  fewer problem with parasitic capacitances than bootstrapping techniques
  higher speed achievable in CMOS at low supply voltages (as low as 1V)
  avoid area penalty associated with use of inductors FIG. 2 shows an exemplary differential T/H 200 with differential sampling capacitor $C_H$, according to an aspect of the invention. The value of N for the W/L ratio of $M_2$ is chosen as N≥2. T/H 200 includes a tracking amplifier 202 and a super-buffer 204 that can hold the input differential voltage on a capacitor $C_H$. During tracking, transistors M5 and M6 are ON and the output differential current of the OTA realized with M1, M2 and M3 is sampled on the resistors R1 at the drains of M5 and M6. At the same time, M9 and M13 are ON, M8 and M12 are biased and the super source-follower stage samples, on capacitor $C_H$, the input voltage amplified at the output of tracking stage. During hold mode, the input differential current from the OTA is dumped via M4 and M7 to resistors R1 at the drains of M4 and M7. In this way the possibility for input feed-through on hold capacitor $C_H$ in hold mode is eliminated. In the hold mode, M8 and M12 are current starved and the current of M11 and M15 flows at the gates of source followers M8 and M12 through the open switches M10 and M14 (open only in hold mode and switched off during tracking), respectively, and pulls down these nodes, insuring that M8 and M12 are completely shut-off so no leakage current flows in the sources of M8 and M12.

Figure 3:
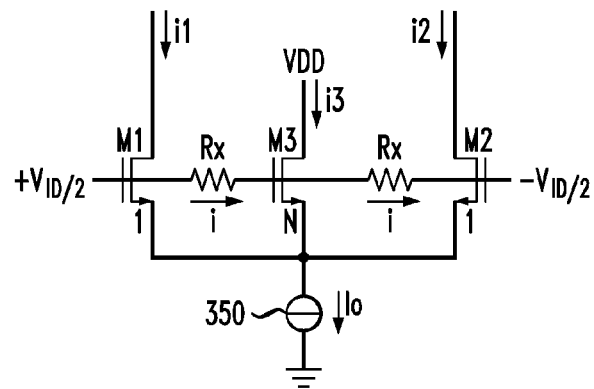
FIG. 3 shows an exemplary linearized operational transconductance amplifier (OTA) stage, according to an aspect of the invention.

The OTA stage, shown in detail in FIG. 3, performs the task of a linear V/I converter that can handle large differential input signals of more than 1V. Besides, it has to work at low supply voltages and should have large bandwidth when a resistive load is added. Denote $K = \mu_n C_{OX} W/L$. In FIG. 3, the following equations apply:

$$i1 + i2 + i3 = I_0 \tag{1}$$

$$2iR_x = V_{ID} \tag{2}$$

$$V_{ID} = V_{GS1} - V_{GS3} + iR_X \tag{3}$$

$$V_{ID} = iR_X + V_{GS3} - V_{GS2} \tag{4}$$

$$V_{ID} = V_{GS1} - V_{GS2} \tag{5}$$

After replacing $V_{GS}$ voltages as a function of drain currents, note the differential current at the output of linearized pair:

$$i1 - i2 = \sqrt{\frac{2 \cdot K \cdot I_0}{N+2}} \cdot \sqrt{1 - \frac{K \cdot V_{ID}^2}{4 \cdot I_0}} \cdot V_{ID} \quad (6)$$

This equation applies for all values of input differential voltage $V_{ID}$. For small input differential voltages $K*V_{ID}^2/(4I_0) \cong 0$, the output current is a linear function of $V_{ID}$ and can be approximated by:

$$i1 - i2 = \sqrt{\frac{2 \cdot K \cdot I_0}{N+2}} \cdot V_{ID} \quad (7)$$

When $K*V_{ID}^2/(4I_0) \ll 1$ an intermediate approximation applies:

$$i1 - i2 = \sqrt{\frac{2 \cdot K \cdot I_0}{N+2}} \cdot \left(1 - \frac{K \cdot V_{ID}^2}{8 \cdot I_0}\right) \cdot V_{ID} \quad (8)$$

This is valid for small and moderate $V_{ID}$ voltages. Analyzing eq. (6) the first observation is that differential output current is independent of the resistors $R_X$. Therefore it is possible to choose the differential input impedance of the OTA independent of linearity. Therefore the only condition for achieving linearization is $R_X > 0$. Another particularity relates to linearization without using extra voltage room. Indeed, there is no extra DC voltage drop on $R_X$. This stage is linearized and needs exactly the same DC voltages as a differential pair without linearization. The price paid is the extra DC current needed for biasing the middle transistor $M_3$. The larger the value of N, the larger the linear range will be but its trans-conductance gain is reduced. A practical value for N is N=4. In this particular case, for small $V_{ID}$ voltages:

$$i1 - i2 = \sqrt{\frac{K \cdot I_0}{3}} \cdot V_{ID} \quad (9)$$

For an A/D converter with medium to high accuracy, the linearity of the T/H in tracking mode is a significant parameter and distortion should not limit the dynamic range of the converter. A differential approach will have less even order distortions and the limiting factor comes from odd order distortions. The ratio between the third order distortion coefficient and the coefficient of fundamental is a measure of the spurious free dynamic range (SFDR) of the T/H amplifier and according to (8) it can be approximated by $HD3/HD1 = \mu_n C_{OX} W/(8I_0*L)$. However, the next stage introduces its own distortion components but negative feedback reduces these components by feedback factor $1+A*\beta$.

Thus, as shown in FIG. 3, there are three field effect transistors (FETs) M1, M2, and M3, and a current source 350. FET M3 is N times larger than FETs M1 and M2. The gates of the FETs are connected through resistors Rx.

Figure 4:
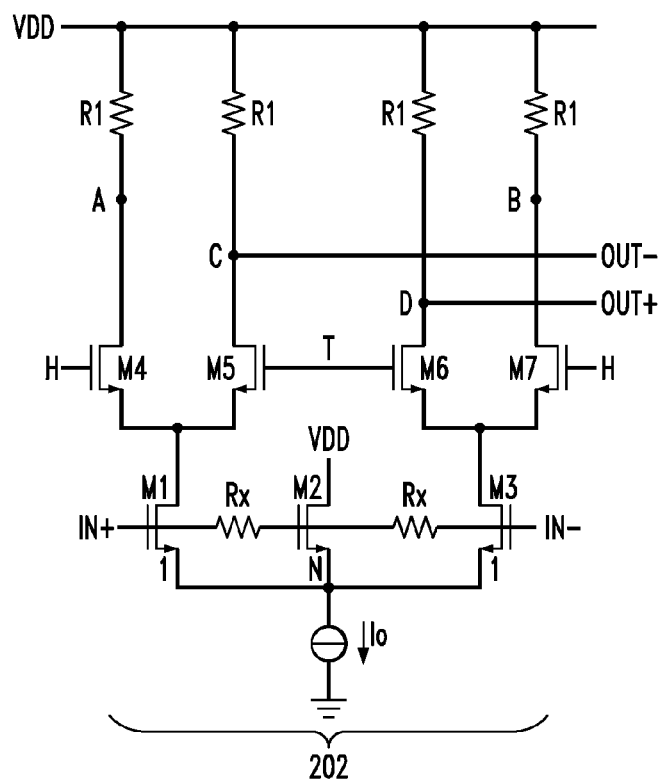
FIG. 4 shows an exemplary tracking stage using the linearized OTA of FIG. 3, according to an aspect of the invention.

With reference now to FIG. 4, another requirement is related to bandwidth limitation in track-mode. The dominant factor for gain-bandwidth of the amplifier is the resistor R1 together with the load capacitance of this amplifier. When switching completely on M5 and M6 during tracking mode, the resistance of the switching transistors is negligibly small compared to R1. That is why R1 is the main contributor to the dominant time constant. A possible approach for the tracking amplifier is to switch-off the under-stage by switching off the current source $I_0$. However, the acquisition time of the T/H will be impaired by the time needed to switch-on the whole under-stage. This is a problem in high-speed A/D converters and, in one or more embodiments, is addressed by diverting the output of the OTA to nodes A and B during hold mode without switching off the OTA and sacrificing speed. The same reasoning applies for aperture time when going from track to hold.

Figure 5:
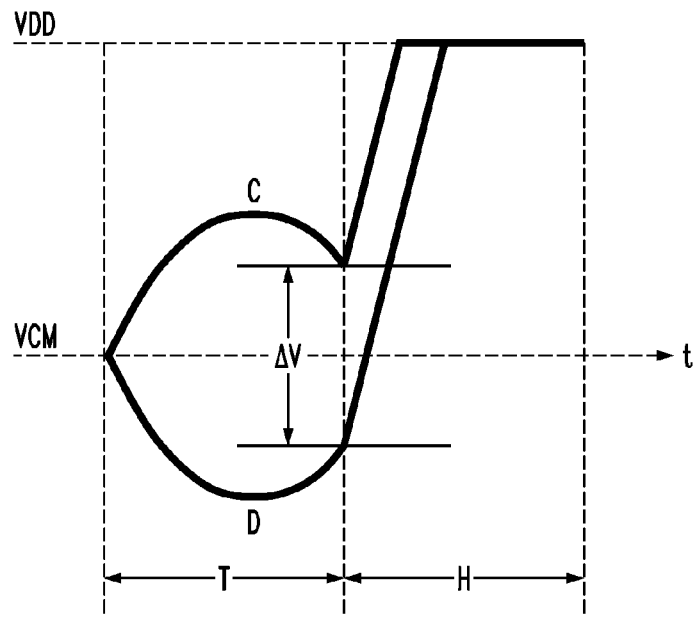
FIG. 5 shows exemplary input feed-through in a hold mode, for the stage of FIG. 4.
Figure 6:
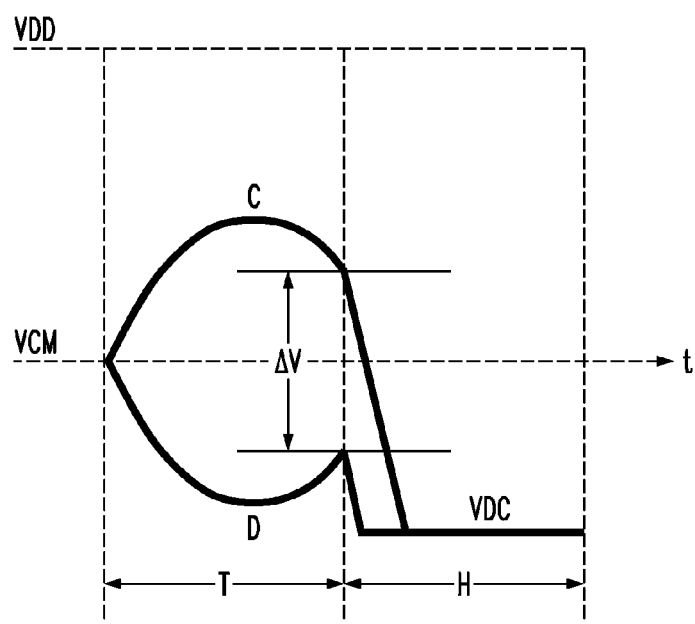
FIG. 6 shows exemplary input feed-through in a hold mode, for the stage of FIG. 4, when a pull-down aspect is implemented.

Without extra measures, during aperture time, the voltages at nodes C and D in FIG. 4 will experience the situation depicted in FIG. 5. In tracking mode (T) the voltages at nodes C and D will go up and down from their common-mode voltage VCM tracking the variation of the input signal. When the hold command is given, the voltage difference $\Delta V$ can be large and since time is needed to switch-off transistors M5 and M6 until the two voltages reach VDD, this difference will be present during aperture time and can generate charge feed-through to the holding capacitor $C_H$ even when M8 and M12 are switched off. As a result, the voltage in hold mode can experience some droop dependent on the voltage difference $\Delta V$. A possible solution is to pull down nodes C and D as depicted in FIG. 6.

As a consequence, the gates of M8 and M12 are pulled down to a voltage VDC<<VDD, thus turning off M8 and M12 much faster.

Figure 7:
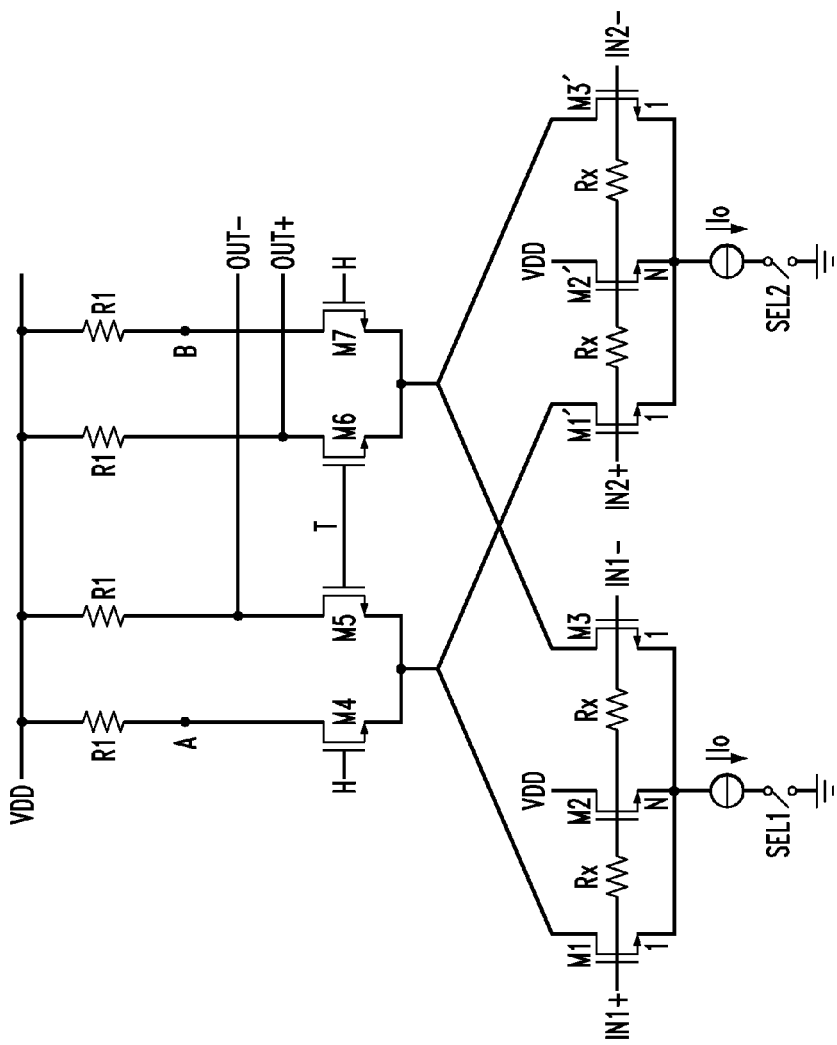
FIG. 7 shows an exemplary tracking stage with a built-in multiplexing function for A/D calibration, according to an aspect of the invention.

In one or more embodiments, another feature related to T/H is a built-in multiplexer function by adding an extra stage switched on with the SEL2 control signal as shown in FIG. 7. By this operation, one can switch-off the input stage with the SEL1 control signal and allow a calibration signal present at the inputs IN2. The calibration signal can be produced by an integrated D/A converter present in the same A/D chip or externally and can be used to calibrate out the static and/or dynamic errors of the T/H together with the A/D converter. Thus, in FIG. 7, the arrangement of FIG. 3 is reproduced twice; the leftmost is enabled by SEL1 for normal use and the rightmost is enabled by SEL2 for calibration.

Figure 8:
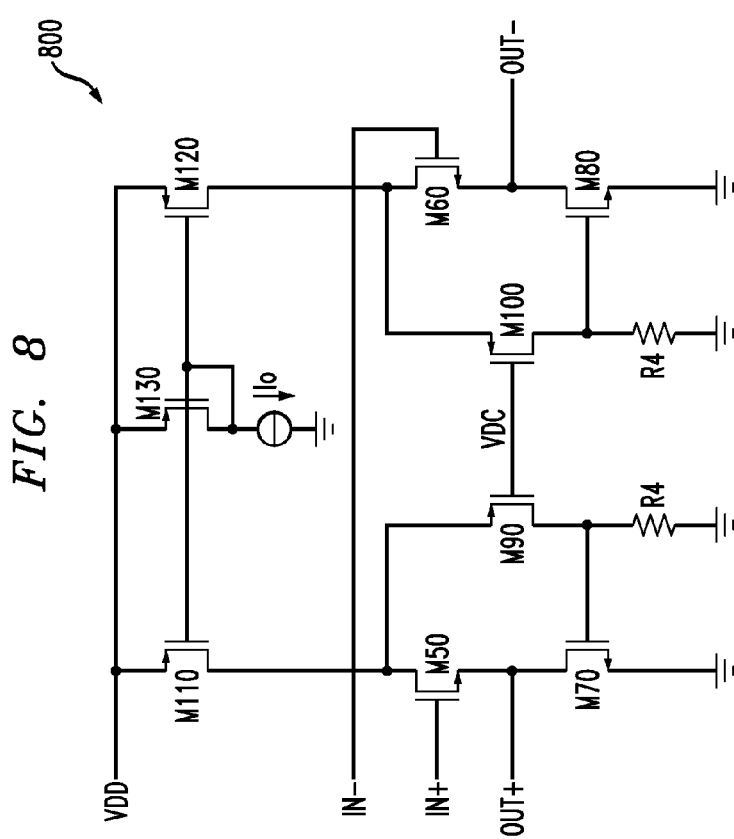
FIG. 8 shows an exemplary super-source follower with differential input signals, according to an aspect of the invention.

For a better understanding the hold stage, FIG. 8 shows a super source-follower 800 with differential input and differential output signals. The task of the feedback loop around M50 and M60 is to force a constant current ($I_0$) in the source followers M50 and M60 and keep the gate-source voltages constant. By this any signal present at the gates of M50 and M60 will be tracked at the output nodes OUT+ and OUT− with low distortion. The PMOS transistors M90 and M100 in the feedback path work as a DC level shifter and their dimension is large enough to provide a large source-drain capacitance and shunt the high frequency components. The resistors R4 are biasing resistors for the gates of M70 and M80. Any variation at the gates of M50 and M60 is amplified in anti-phase at their drains and amplifies in phase the signal at the sources of M50 and M60. As a consequence of feedback the output impedance of the source follower is very low, in the order of 10Ω up to 10-12 GHz. Therefore it can drive large capacitive loads in order of few pF. The advantage of using a large hold capacitor resides in its capability of holding a larger charge compared to charge injected by clock signals when switching from track to hold mode. M110 and M120 mirror I0 through M130.

Note that standard transistor symbols are used herein: all field effect transistors (FETs) have gate, drain and source; NMOS source has arrow pointing out and PMOS source has arrow pointing in.

Figure 9:
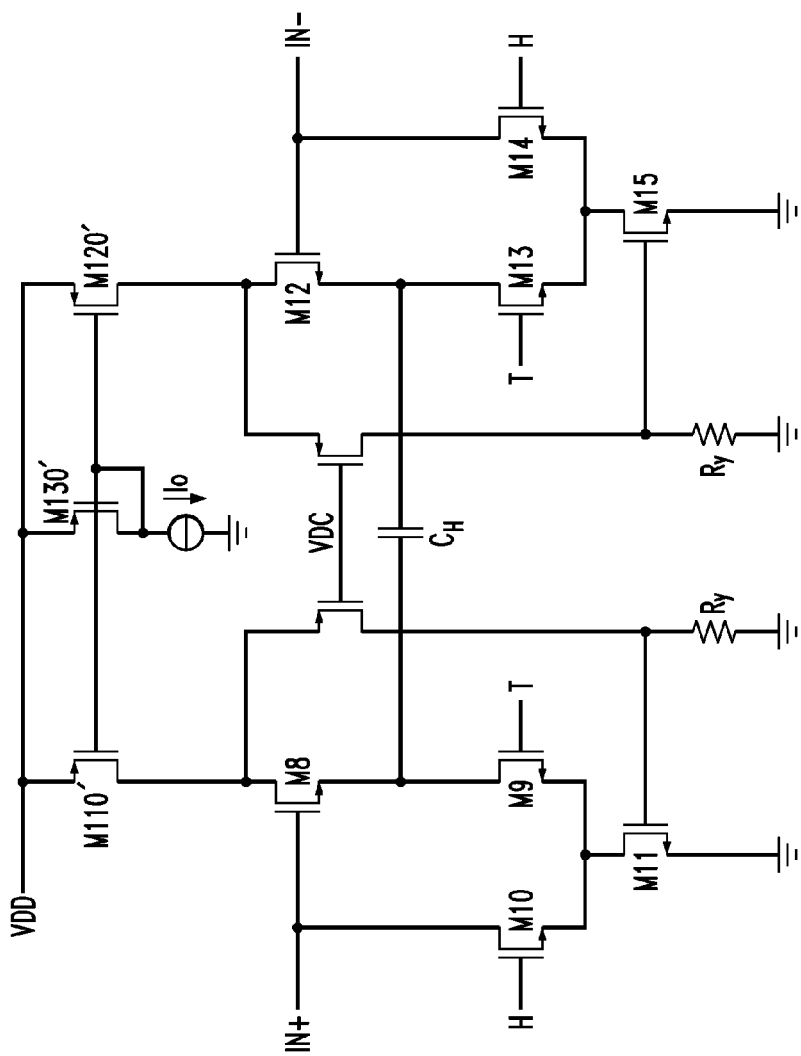
FIG. 9 shows an exemplary super-source follower with track and hold controls, according to an aspect of the invention.
Figure 10:
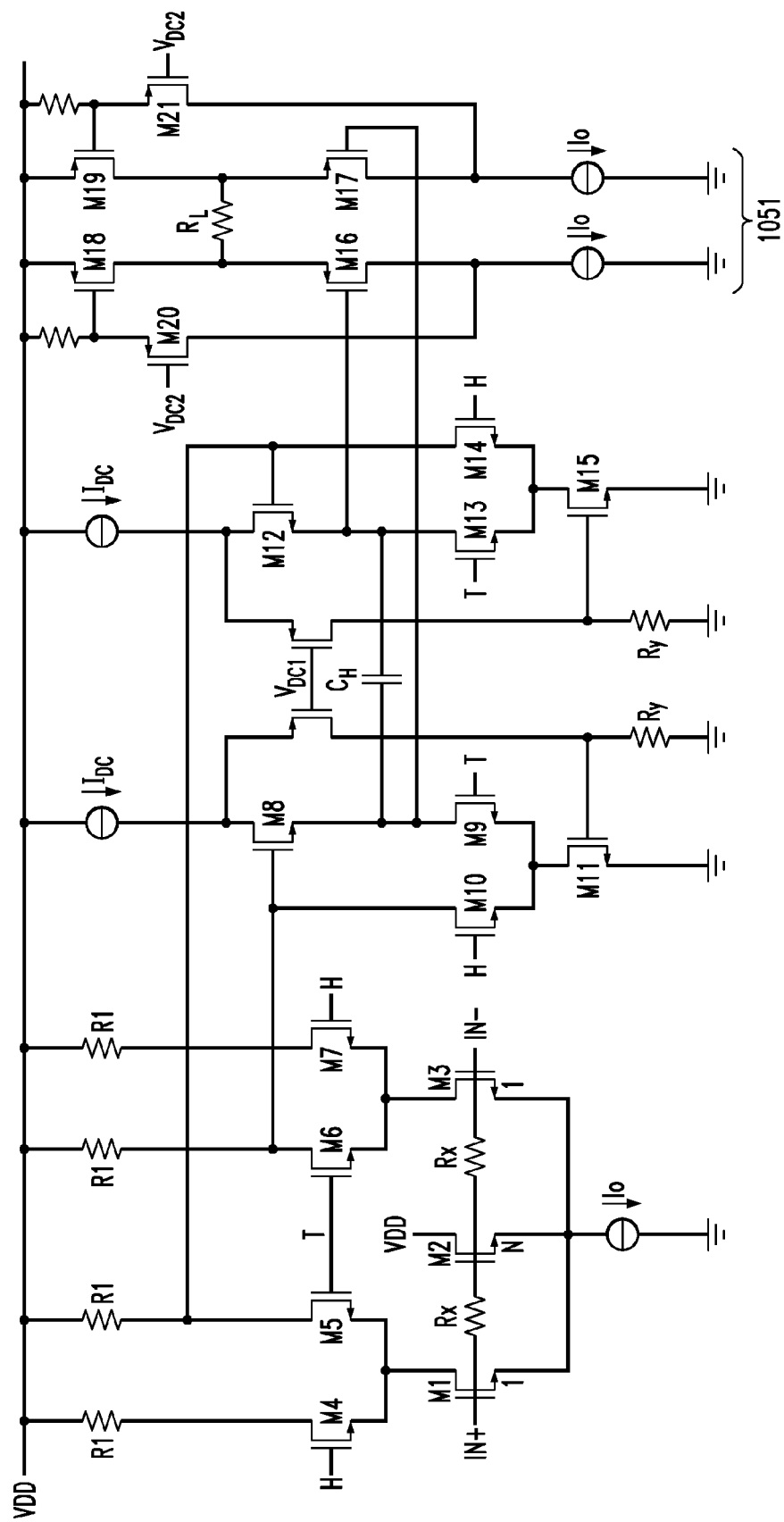
FIG. 10 shows an exemplary T/H amplifier with output buffer, according to an aspect of the invention.

FIG. 9 shows the same differential super source-follower with track and hold control signals. Compare to element 204 in FIG. 2. M110', M120', and M130' are analogous to M110, M120, and M130. The transistors M9 and M13 are included in the feedback loop providing a mechanism to hold the input differential signals on the hold capacitor $C_H$. In track mode, the feedback loop is active and the correction signal is present at the output of source follower. In hold mode, transistors M8 and M12 are current starved and the hold capacitor cannot be discharged. The current of M11 and M15 are diverted to the gates of M8 and M12 pulling down these nodes as explained previously in FIG. 6. Because holding capacitor $C_H$ is large and the output impedance of this stage is very low, this stage can directly drive many comparator slices of an A/D converter. However, due to low common-mode present at the outputs (~350 mV), in at least some embodiments, only PMOS comparators can be used. This is an advantage as long as matching of PMOS transistors is better when compared to their NMOS counterparts. This is less and less evident in deep submicron processes beyond 65 nm CMOS. Another alternative is to use another active stage 1051 as depicted in FIG. 10. This is a PMOS super source follower with 750 mV output common-mode.

Figure 11:
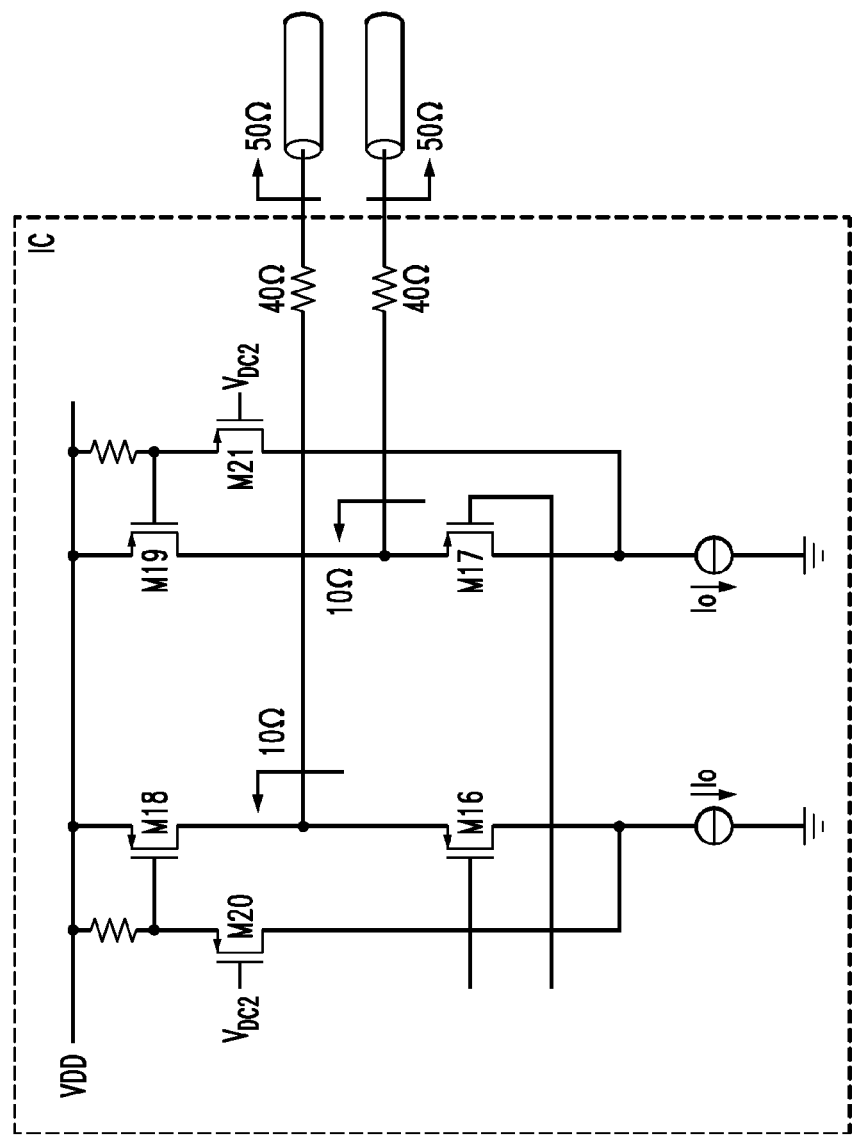
FIG. 11 shows an exemplary output buffer for driving 50 Ohm loads, according to an aspect of the invention.

It can directly drive comparator slices in an A/D converter or, with slight change, a 50Ω load, as shown in FIG. 11 (RL is removed in case comparator slices are driven and is modified as in FIG. 11 when driving a 50Ω load). A series resistor of 40Ω together with 10Ω active impedance coming from the output buffer can match a 50Ω impedance of a measuring instrument.

It should be noted that M16-M21 in FIGS. 10 and 11 represent a super source-follower, described above, but realized this time with PMOS transistors. M16 and M17 are the main followers of the buffer. The output impedance of the super-follower is around 10Ω and together a series resistor of 40Ω can drive an external 50Ω load for measurement purposes.

In a flash ADC working at low supply voltages in the order of 1V, the reference voltages are limited by overall supply voltage. Charge pumps can boost the LSB (least significant bit) values of a resistive ladder beyond $VDD/(2^N-1)$ with the price paid of introducing switching noise on the reference voltages. However, a limiting factor is related to the FS (full scale) output of the T/H amplifier limited by SFDR and supply voltage. Another limitation is the supply voltage of the stage preceding the T/H. In a radio receiver this amplifier is the intermediate frequency (IF) amplifier after the analog anti-aliasing filter. This stage has its own linearity problems and that is why different IF stages have different FS output.

Figure 12:
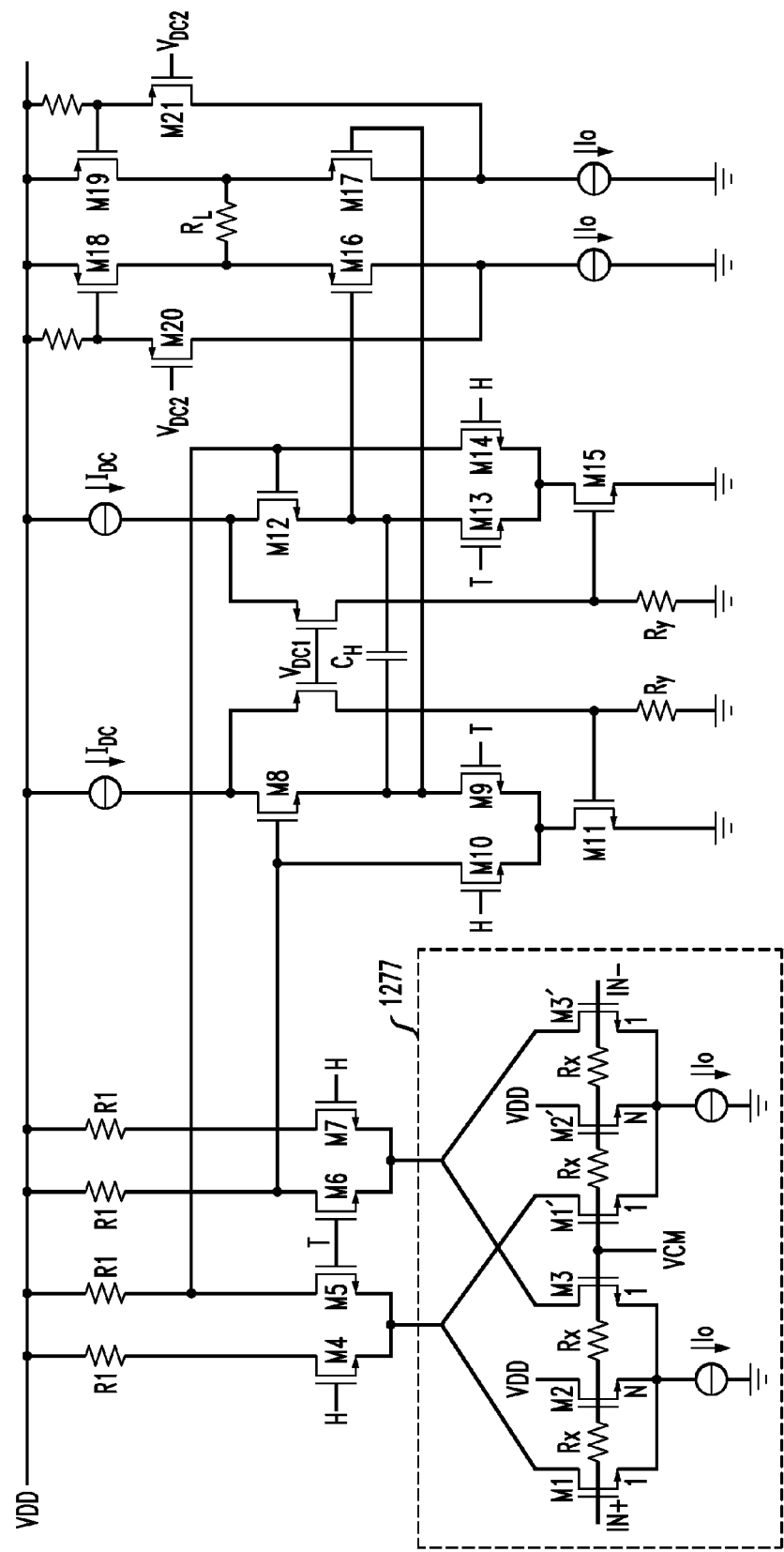
FIG. 12 shows an exemplary T/H amplifier with extended input linear range, according to an aspect of the invention.

In order to extend the linear range of the T/H amplifier, the linear stage at the input can be modified as shown at 1277 in FIG. 12. In this aspect, the input stage can handle signals in the order of 2Vpp differential without distorting the input signals with a supply voltage of only 1V. This is an advantage in the case of A/D converters that can handle large dynamic range signals with only one digital AGC function and no analog AGC in front of the A/D converter. Basically, two linearized pairs are connected in series at the input and the common input connected to a common-mode voltage equal to the common-mode voltage present at the IN+ and IN− inputs. Note similarity to FIG. 7, except that common mode voltage VCM is applied to IN1− and IN2+ of FIG. 7 and IN1+ becomes simply IN+, with IN2− becoming simply IN−. For flexibility reasons, the gain of the tracking stage can be adjusted in a digital manner with switched resistors as in FIG. 13 (resistors R1 replaced with four resistors of R1/4 with one always in line and the remaining three optionally shorted by switches B0, B1, and B2). That is, the load of the tracking stage has been segmented in smaller resistors and PMOS switches can shunt parts of the load to supply. The digital control signals B0, B1, B2, B3, B4 . . . in thermometer code are generated from a digital interface and are a part of the A/D system. Therefore, the digital AGC function in the digital domain can be extended with some analog gain control with the purpose that the FS signal at the output of the T/H is always constant for input signals having a differential FS amplitude of 400 m Vpp÷1000 m Vpp. With the output buffer, the differential FS output of the T/H is 800 m Vpp. Without the output buffer, the differential FS output on the hold capacitor $C_H$ is 950 mV.

Figure 14:
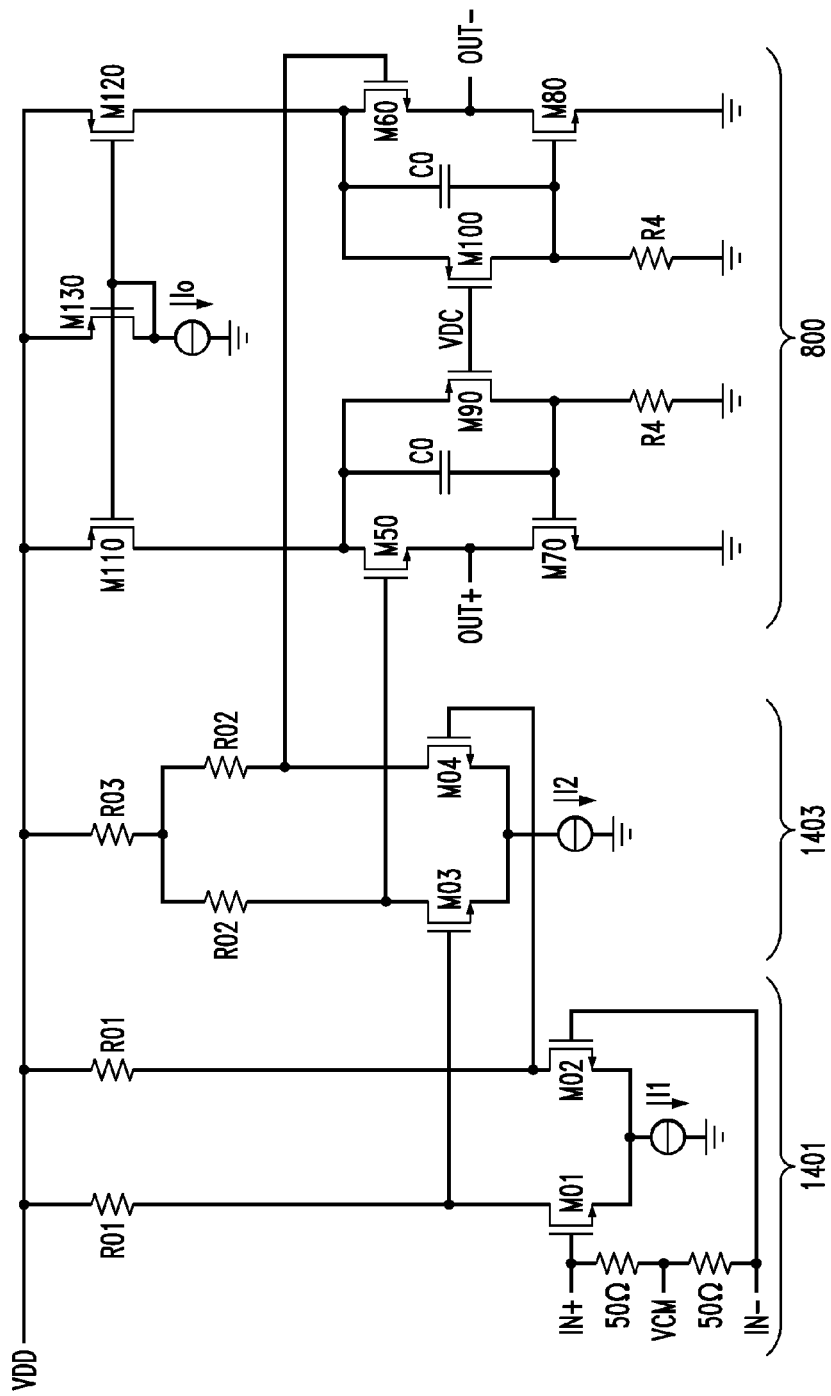
FIG. 14 shows an exemplary clock buffer with limiting stages and active source follower, according to an aspect of the invention.

The T/H amplifier is preferably provided with a differential CML clock buffer with limited swing on the order of 600 mVppdiff and a well specified common-mode voltage at the output. FIG. 14 shows a clock buffer with limiting stages 1401, 1403 and active source-follower 800. Note in stage 1401 differential pair M01, M02 with resistors R01 and current source I1. Note in stage 1403 differential pair M03, M04 with resistors R02 and current source I2. The use of CML type signals for the clock reduces clock feed-through from the clock generation and distribution via supply and substrate. This is a significant feature for medium and high resolution converters as with limited supply voltages in the order of 1V and FS signals below 800 mVpp, the LSB will be in the order of ~1 mV and below. Those reference levels are susceptible to perturbations from clock distribution circuitry. A differential approach would not inject charge in the supply lines during the transitions in the clock signals. In FIG. 14, the first two stages 1401, 1403 act as a limiting amplifier. The second differential pair M03, M04 has a DC level shifter with resistor R03 in order to bring the output common-mode level at the desired value. In order to drive a transmission line (a clock distribution line), the last stage is a super-source follower 800 with low impedance and peaking control from capacitors $C_0$. At room temperature, the step response of the clock buffer has some overshoot that is reduced at higher temperatures (~80° C.) and provides sharp rise and/or fall times for the clock signals.

Figure 13:
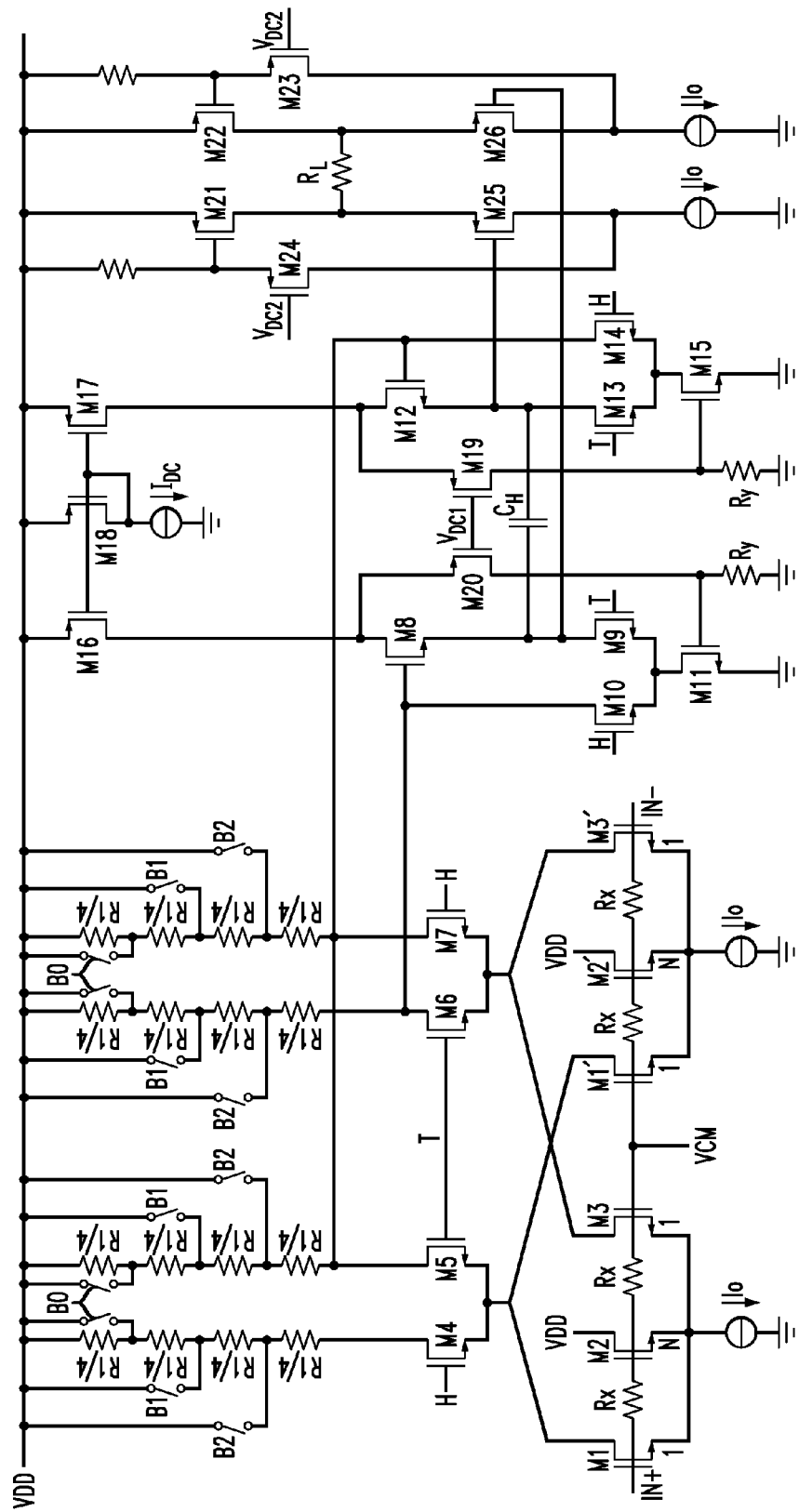
FIG. 13 shows an exemplary T/H amplifier with extended input linear range and digital gain control, according to an aspect of the invention.
Figure 15:
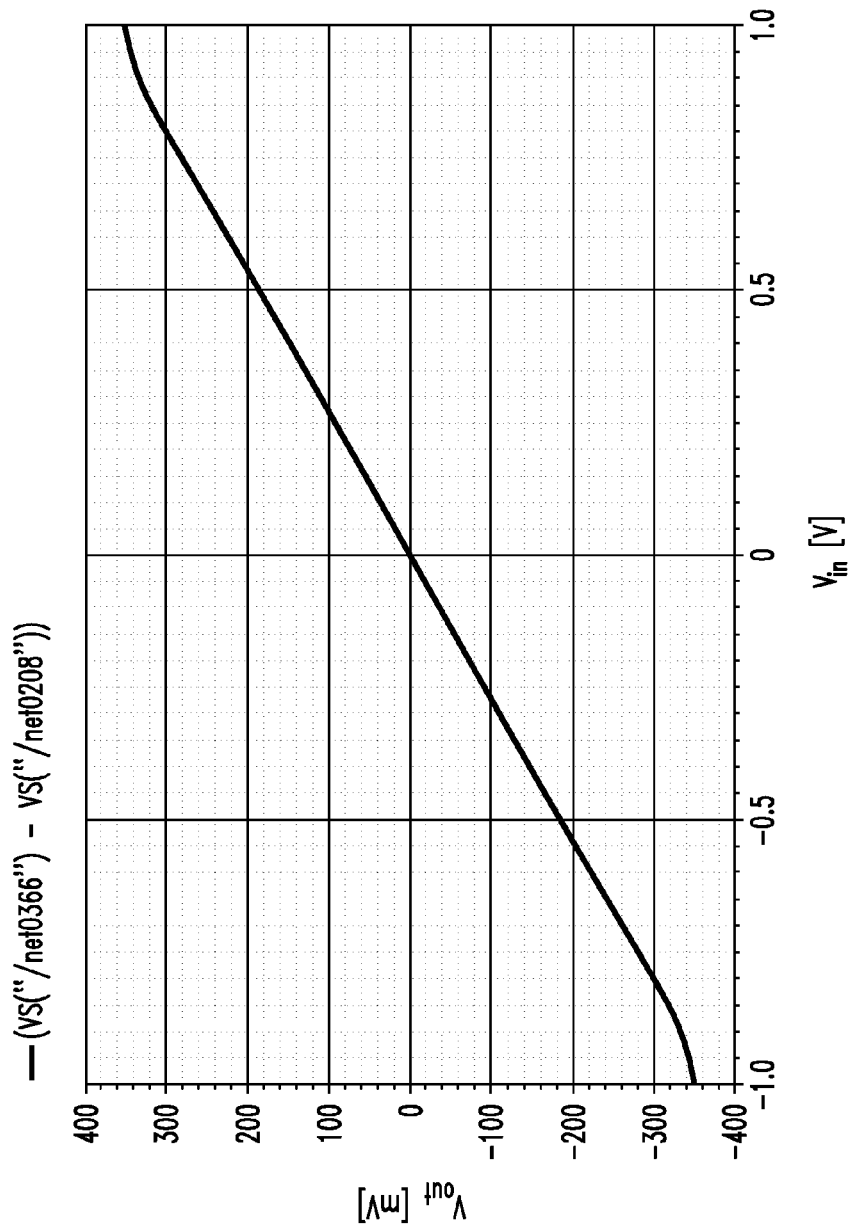
FIGS. 15-18 depict non-limiting exemplary simulated performance of one non-limiting exemplary embodiment of a T/H amplifier.
Figure 16:
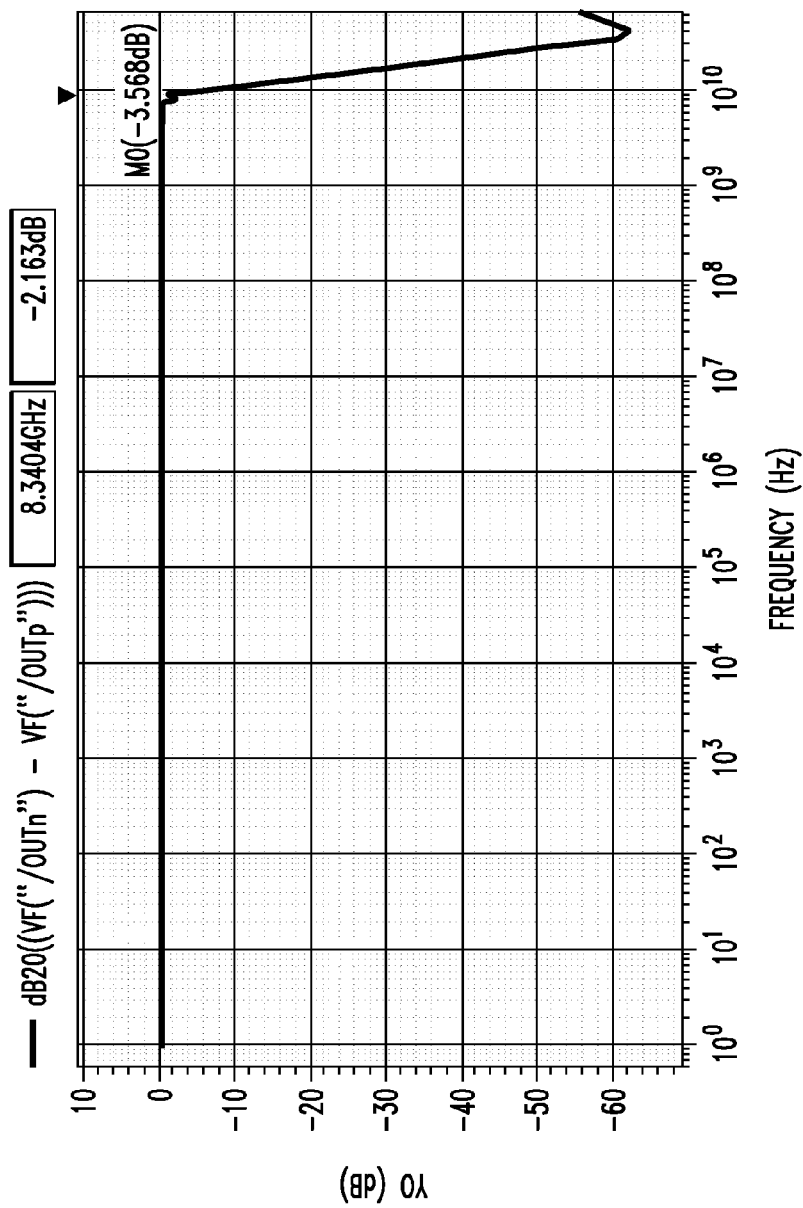
Figure 17:
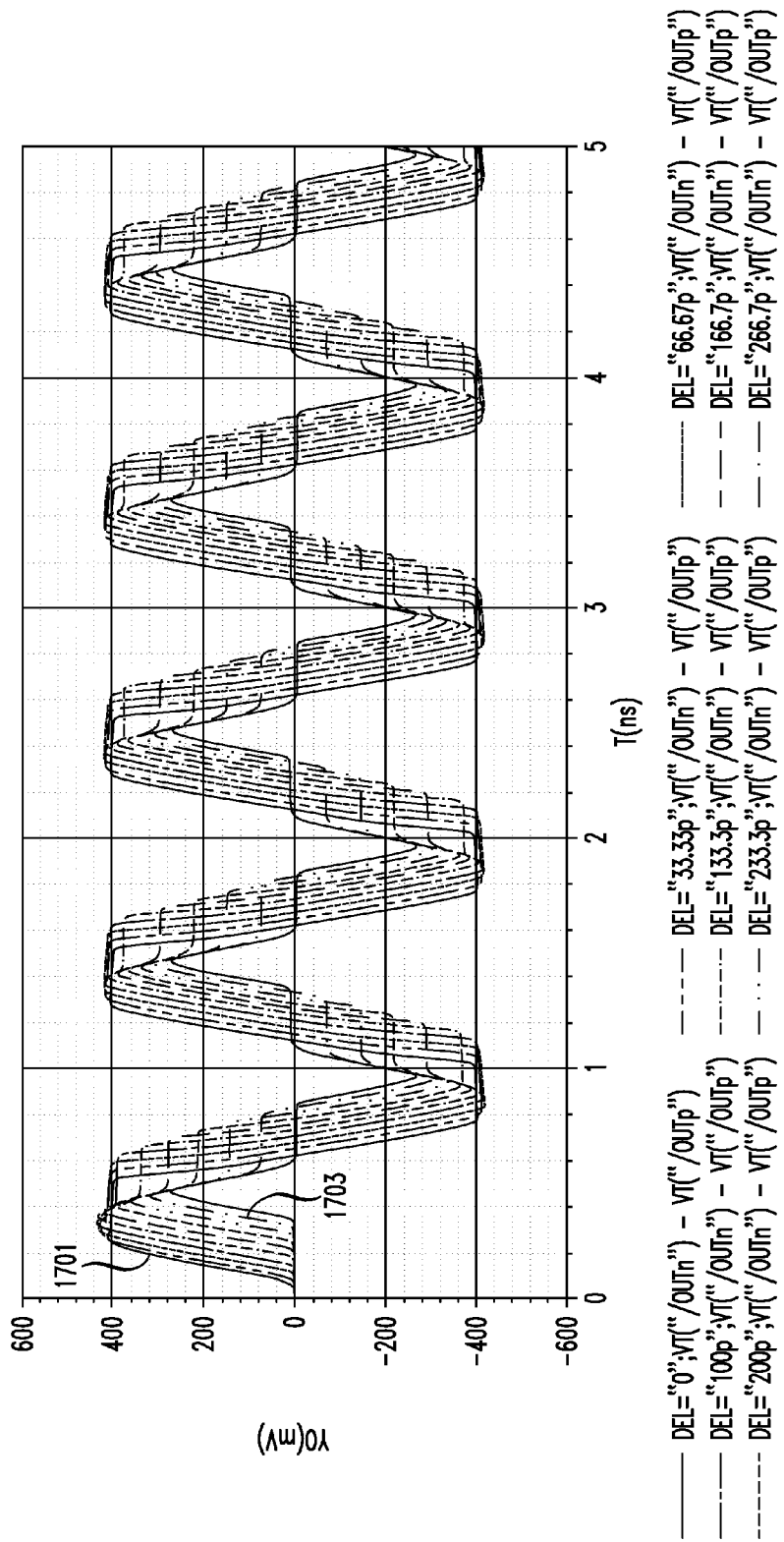
Figure 18:
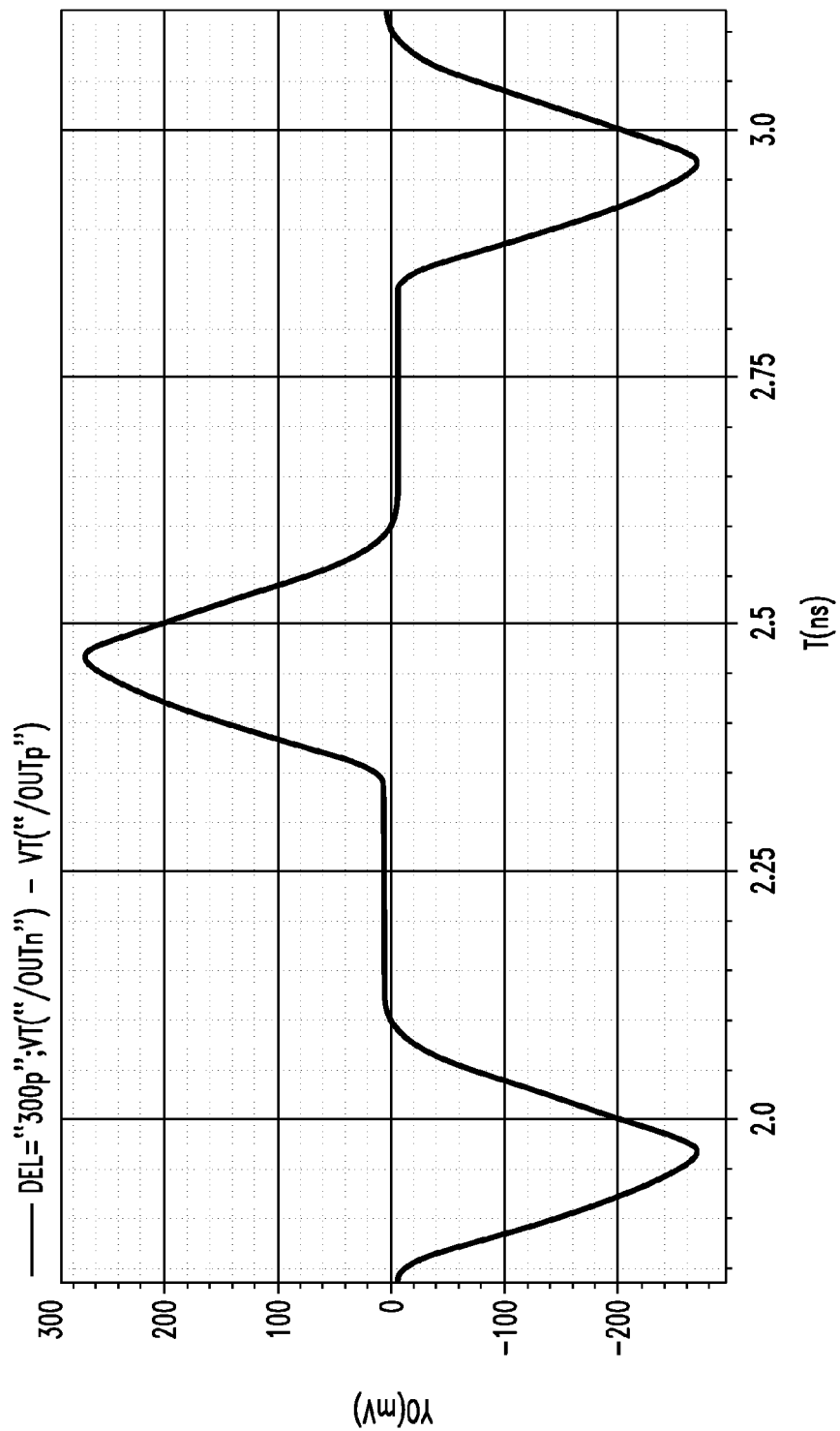

FIG. 15 presents simulated input/output DC transfer for the embodiment of FIG. 13 with a linear input range of from about −1V to about +1V. FIG. 16 presents simulations showing that the tracking bandwidth is about 8.3 GHz which helps maintain the effective number of bits (ENOB) high at the Nyquist frequency. FIG. 17 presents simulated tracking of a 1 GHz sinusoidal signal for values of DEL ranging from zero, at 1701, to 266.7 p, at 1703, in 33.33 p intervals. It is to be appreciated that the variable delay DEL represents the delay between the input sinusoidal signal and the sampling clock. The largest signal represents the situation when we are sampling the input sinusoidal signal at the top, when signal imbalance at the input is at its maximum. FIG. 18 presents simulations showing that there is a 200 μV droop in the hold mode, which is much less than the value of LSB/2.

One or more embodiments thus provide a low voltage, high speed differential track and hold, capable of a large input swing (due to linearized OTA) and having an extended linear range with two stages. In at least some instances, the input signal is switched to dummy nodes during hold mode which reduces signal feedthrough in the hold mode. Furthermore, in at least some cases, the gates of the output buffer are pulled down to achieve low signal feedthrough during hold times. One or more embodiments provide a high linearity active buffer with track and hold control, a built-in multiplexing function for calibration, and/or digital automatic gain control for different FS at the input. In addition, one or more embodiments employ a PMOS active buffer for driving large capacitive loads. Furthermore, in at least some cases, no clock injection implies differential and low swing current mode logic. One or more embodiments are suitable for medium to high resolution analog-to-digital converters, and/or can be implemented in modern CMOS processes at low supply voltages (on the order of 1 V). One or more instances have low even order distortions and can drive large capacitive loads, and/or have the possibility of calibration for high-end A/D.

Figure 19:
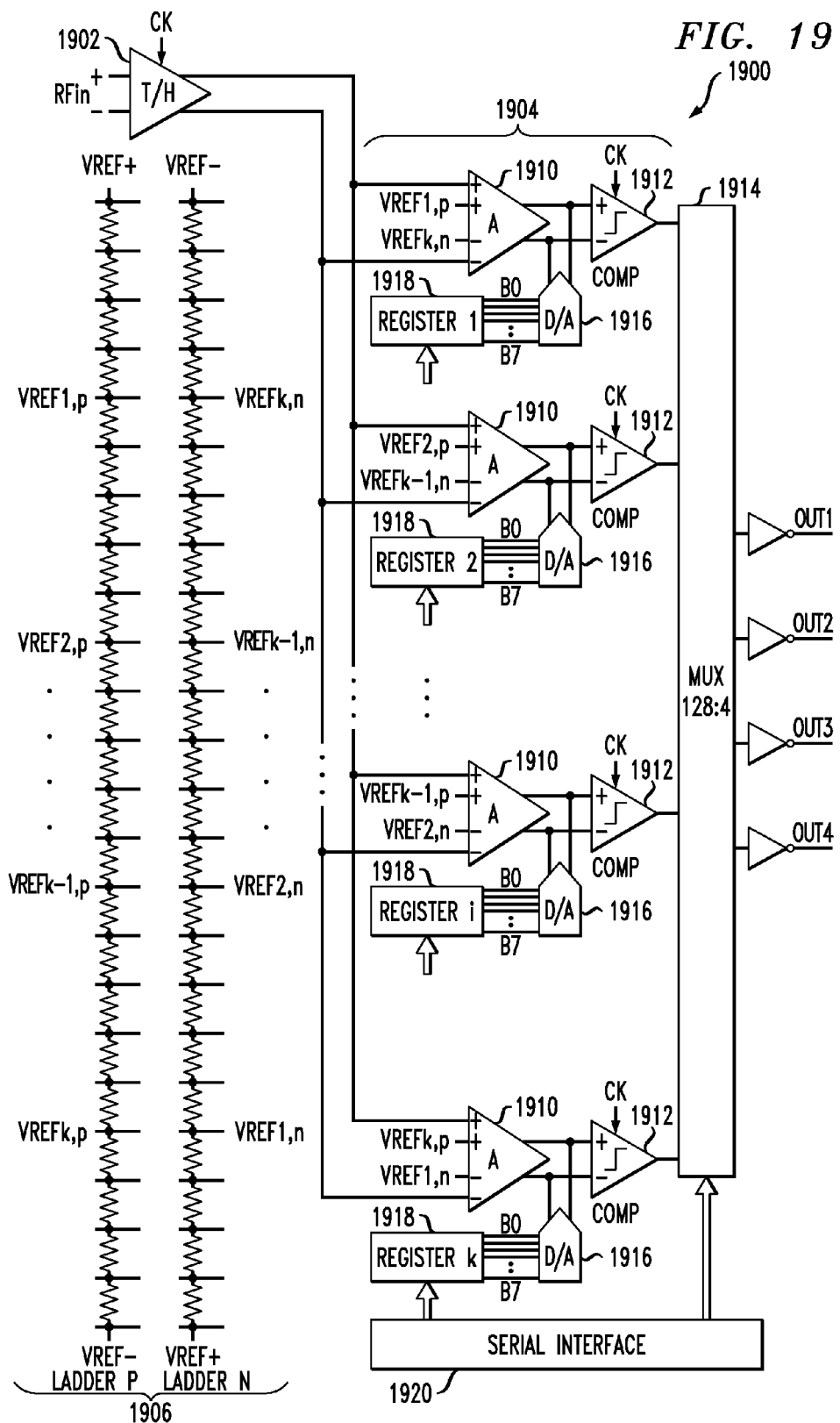
FIG. 19 shows an exemplary pseudo-differential T/H amplifier implemented with differential slices and a differential ladder, according to an aspect of the invention.

FIG. 19 shows an exemplary A/D converter 1900 using a track and hold amplifier 1902 (for example, such as described elsewhere herein). Flash converter 1904 takes references from voltage ladder 1906. The references are fed to one input of a corresponding amplifier/comparator stage (four stages are depicted for convenience of illustration, each with an amplifier 1910 and comparator 1912). A 128:4 multiplexer 1914 multiplexes the outputs of the comparators to outputs OUT1-OUT4. The approach in FIG. 19 is differential, with a pseudo-differential T/H 1902, differential slice and differential ladder 1906. This helps ensure immunity for common-mode perturbations. A small current D/A 1916 is embedded in each slice for calibration. Almost minimum size devices can be sued in the preamp 1910 and comparator 1912. Offset calibration permits very low power flash. Local memory registers 1918 are provided for the D/A settings. A single data bus can be shared by all slices, and serial interface 1920 can be provided for programming the D/As 1916. Note that the data bus for programming D/As is represented in FIG. 19 as arrows going from the serial interface to the local registers.

Figure 20:
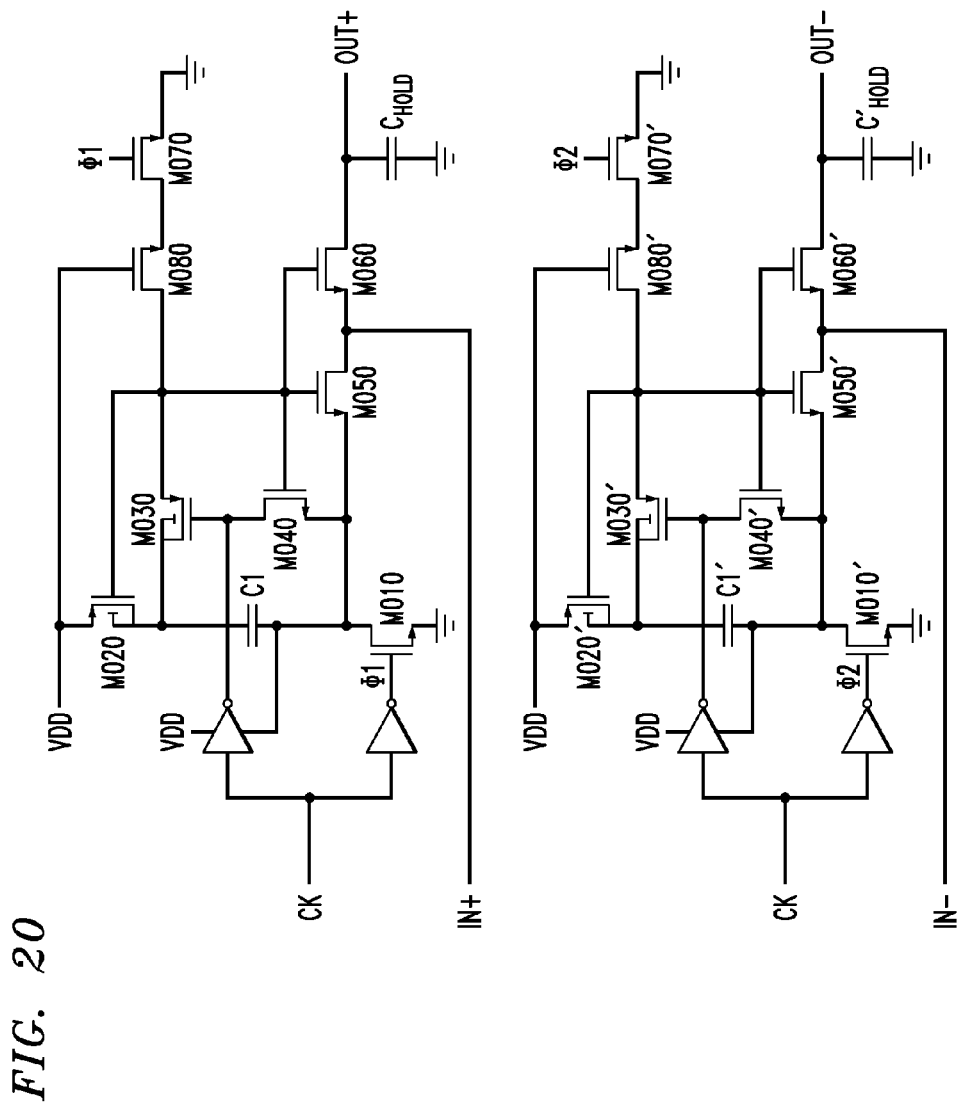
FIG. 20 shows elements of an exemplary boosting circuit, according to an aspect of the invention.

FIG. 20 shows non-limiting exemplary details of the T/H 1902. A pseudo-differential, bootstrapped switch T/H amplifier is employed in this example. It is suitable for low voltage operation. The purpose of the bootstrapping circuit is to maintain a constant gate-source voltage during the input signal swing, reducing second order distortions, and provide reliable operation by ensuring that drain-source and gate-source voltages of the switch (M060) are below VDD. In hold mode, the switch transistor M060 is off, M010, M020 and M070 are turned on, M030 and M050 are turned off and the bootstrap capacitor C1 is charged between VDD and ground. When the switch is on (track mode), the bootstrap capacitor is disconnected from VDD and ground and connected between the source and gate of the M060 switch. Therefore, the gate voltage is equal to the source voltage shifted by VDD. The cascode transistor M080 provides reliable operation when the gates of M050 and M060 are charged to a voltage beyond VDD. In worst case, the gate can be as high as 2×VDD and the cascade transistor, in series with M070, is responsible for some voltage drop. The components designated with primes in the lower half function analogously.

Figure 21:
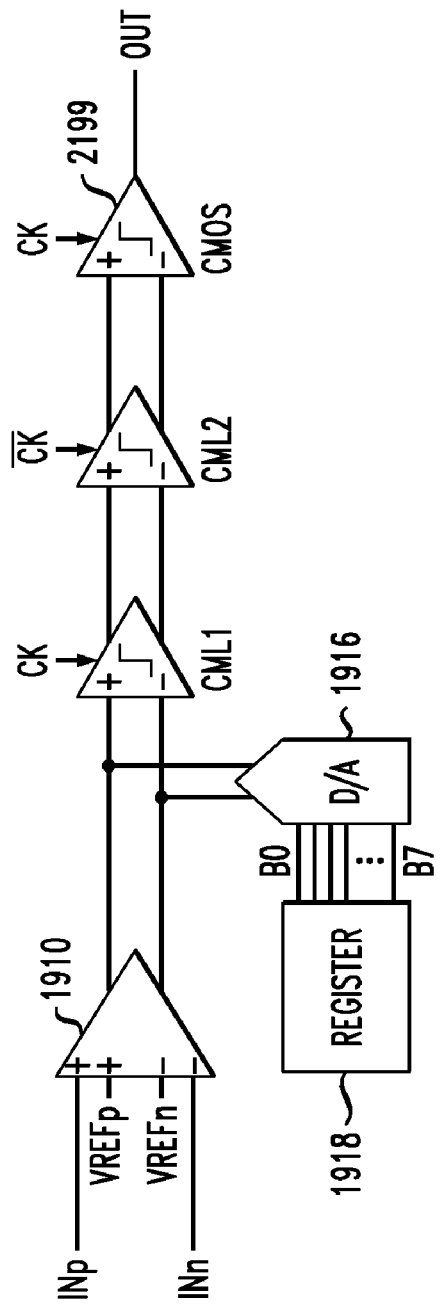
FIG. 21 shows an exemplary slice with three types of latches, according to an aspect of the invention.
Figure 22:
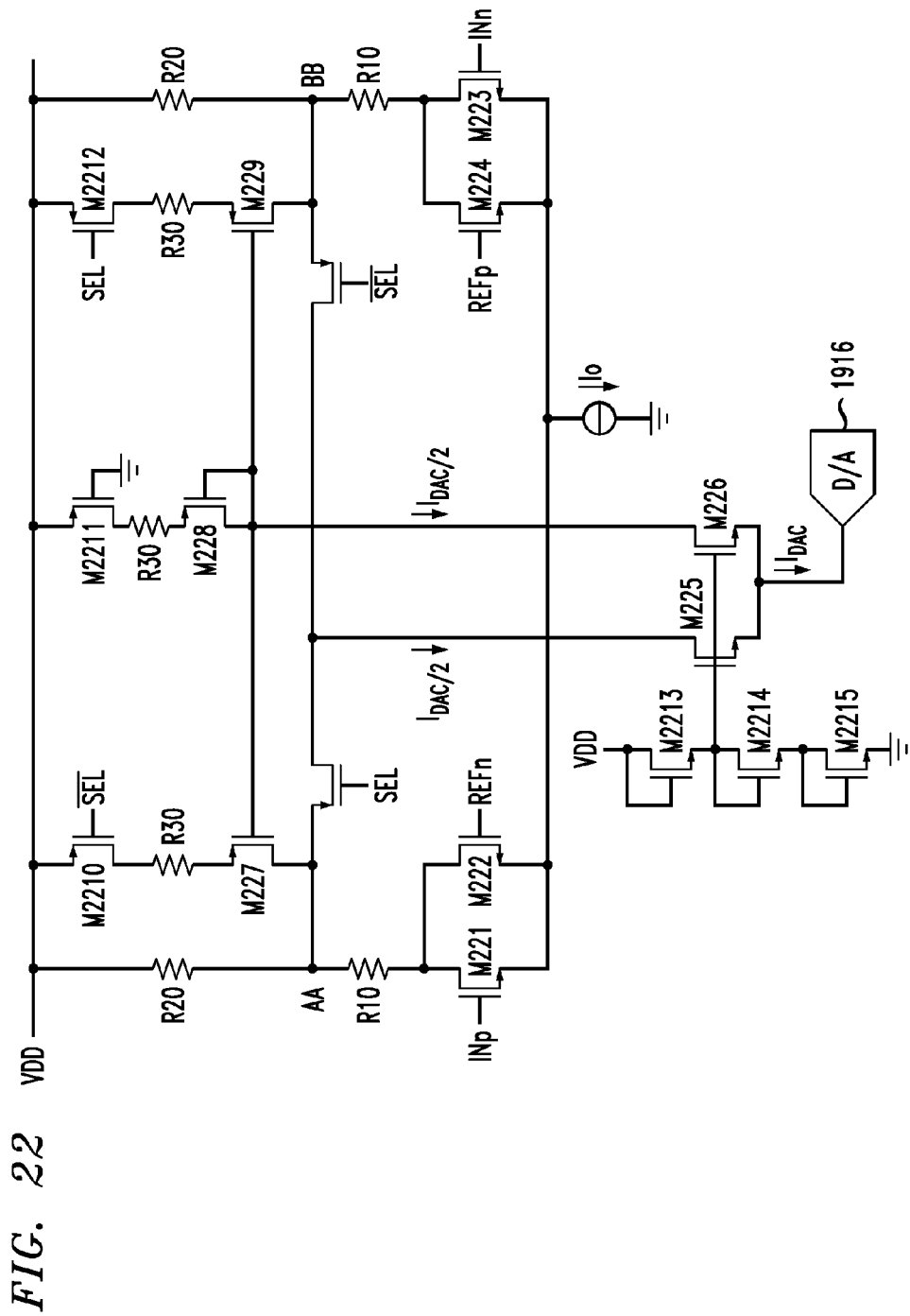
FIGS. 22-24 show elements of an exemplary differential preamplifier with segmented load, according to an aspect of the invention.

For exemplary details of the slices see FIG. 21. Each slice includes a pre-amp 1910, CML1 and CML2 which latch without full swing, and CMOS latch 2199 with full swing. As best seen in FIG. 22, if the output voltages of the preamp 1910 are imbalanced due to offset from the preamp or capacitors, D/A 1916 injects current at the load of the preamp to correct this. Note that a differential preamplifier with segmented load R10, R20 is employed. This implies finer LSB voltage, and offset correction does not impair the gain and bandwidth of the stand-alone preamp. The offset correction currents are applied at nodes AA and BB. The SEL signal controls the offset correction polarity. The D/A current $I_{DAC}$ is divided into two equal currents $I_{DAC}/2$ and thereafter injected in AA and BB. The output of the preamp is taken at the drains of M221, M222 and M223, M224, respectively. See FIG. 23 for the case where the SEL signal is zero and FIG. 24 for the case where the SEL signal is one.

The DAC is thus a current DAC with current output. M225 and M226 foam a current splitter—since they have the same Vgs, I is equal. Due to the use of the current mirror, the current in the middle can be repeated on the left or right by throwing the corresponding switch. Thus, currents are injected in differential mode to nodes AA and BB. M221, M222, M223, and M224 form portions of the preamp. The preamp has the load segmented. The connection is to the segmented load and not directly to output, to avoid impairing bandwidth. M228 mirrors the current IDAC/2 (after the current divider M225, M226) in the transistor M227 and M229 when the switches in series with R30 are open. R30 insures local negative feedback for improving the accuracy of the mirror by increasing its output impedance. M2211 matches the series resistance of the switches, hence improving the accuracy of the mirror.

Figure 25:
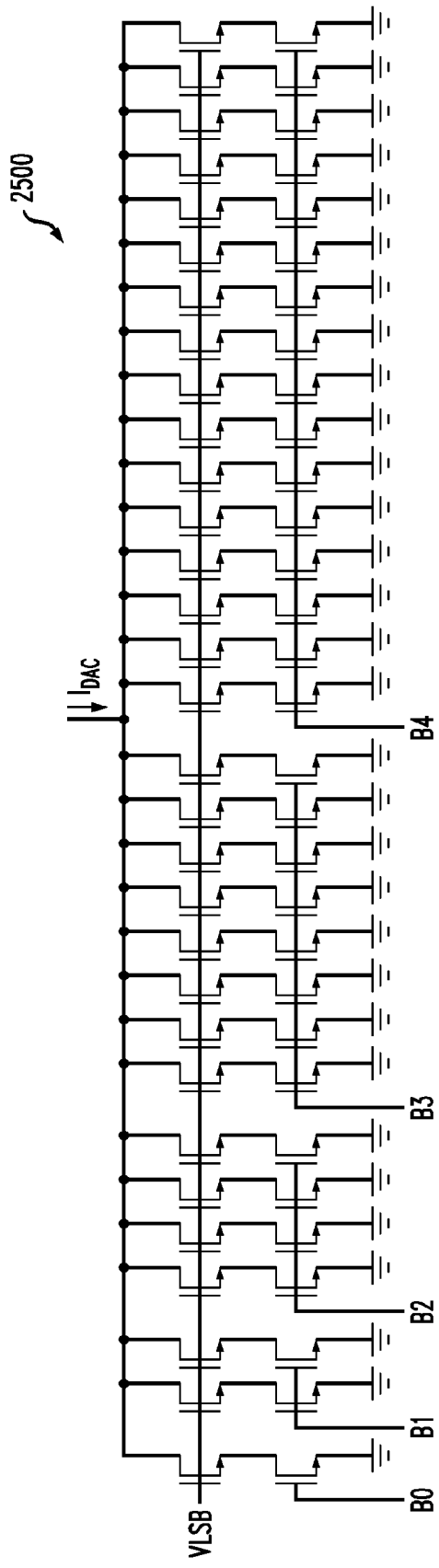
FIG. 25 shows an exemplary seven-bit binary weighted D/A, according to an aspect of the invention.

FIG. 25 shows the DAC implementation 2500, using identical stages. The seven-bit binary weighted D/A with identical unity D/As implies matching. The VLSB biasing voltage is employed. Signal B0 bit turns B0 on and current comes to unity gain in the IDAC output, while the other bits are off—a binary weighted converter. When B1 is turned on, I0+2I0 is obtained; when B2 is turned on obtain I0+2I0+4I0. One or more embodiments of the invention use identical cells which match well and therefore the converter is monotonic by design. Advantageously, one or more embodiments do not require poly resistors for matching, implying small size. The LSB of the ladder and the D/A are preferably decoupled. Control of the LSB from the VLSB signal allows beneficial speed-accuracy tradeoff.

Figure 26:
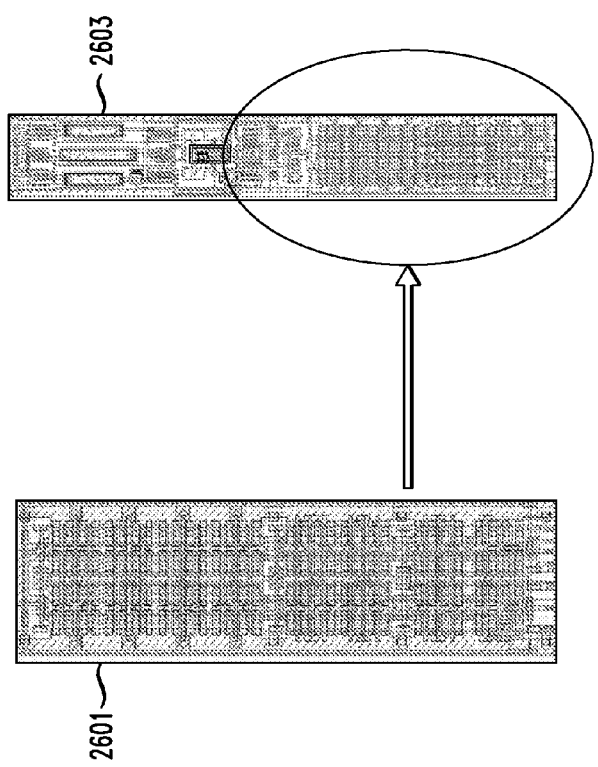
FIG. 26 shows the seven-bit binary weighted D/A of FIG. 25 fitting into the slice of FIG. 21, according to an aspect of the invention.

FIG. 26 depicts a manner of construction allowing a compact design where the transistors are close. The D/A 2601 preferably fits in a "SLICE" 2603 having dimensions of approximately 4.5 microns by 30 microns. Use of abutment in the unity D/A allows the compact size.

Figure 27:
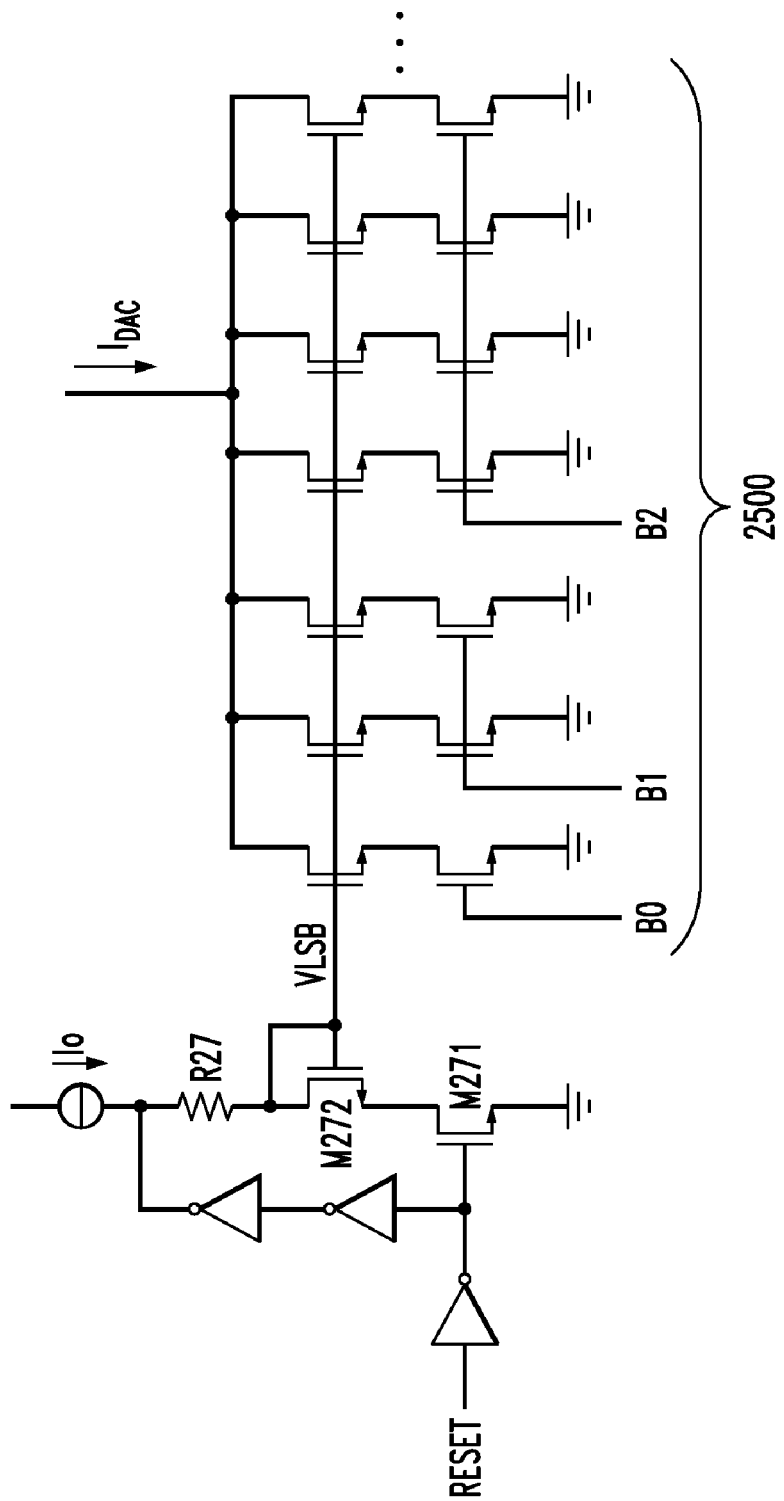
FIG. 27 an exemplary reset mechanism, according to an aspect of the invention.

FIG. 27 depicts an exemplary reset mechanism with digital control. When RESET=one, $I_{DAC}$ is zero. During the calibration cycle, $I_{DAC}$ is zero. At the end of calibration, RESET=zero and the calibrated value is loaded. When RESET=0, the output of the first inverter is high and close to VDD, and the switch 271 is open. Therefore, the current Io can flow through R27, M271 and M272 to ground, generating the reference voltage necessary to bias the DAC. The inverter present at the terminal of Io will not influence the voltage at the gate/drain of M272 or VLSB. When RESET=1, the output of the first inverter is low and the switch M271 is shut off. At the common terminal between Io and R27 the inverter's output goes low and the whole current Io flows in this inverter without biasing M271 and M272. Therefore, their current is zero volts, ensuring that the mirrored current in the DA is zero. By this, no residual offsets are created at the output of the preamplifier.

Figure 28:
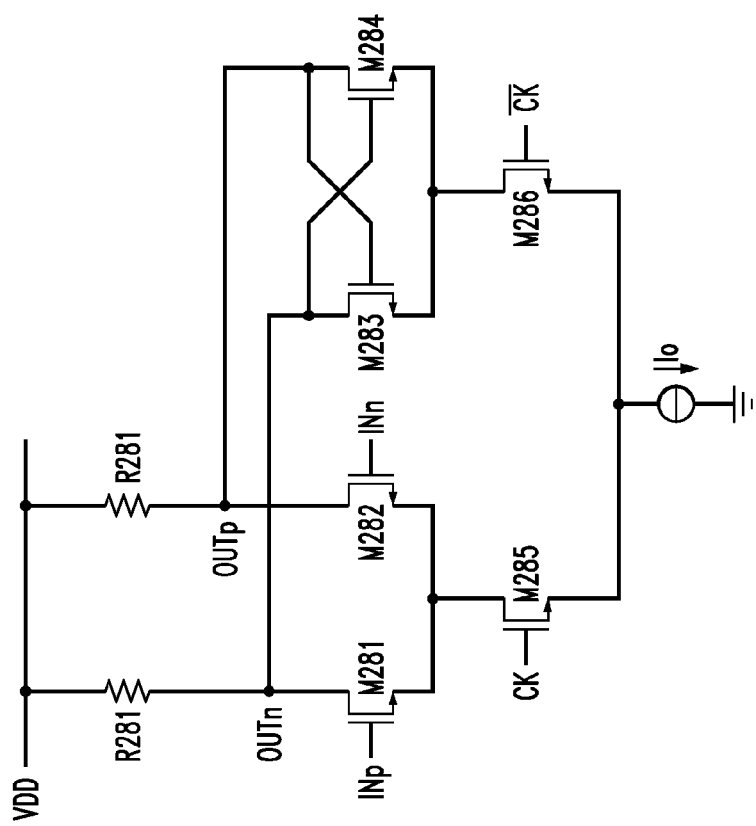
FIGS. 28-30 show the three types of latches of FIG. 21, according to an aspect of the invention.

FIG. 28 shows an exemplary implementation of the first (CML1) latch-comparator with low voltage swing. It matches the preamp common mode levels and is preferably provided with low voltage swing CK signals, applied to the gates of M285 and M286 (true and complementary, respectively). The positive and negative inputs are applied to the gates of M281 and M282, respectively, and the outputs taken on the drains of M281 and M282 (which are coupled to the drains of M283 and M284, respectively). The load resistors R281 act as a resistive load, common for the preamplifier M281/M282 and latch M283/M284. The resistive load amplifies the input imbalance between INp and INn during amplification phase when CK=high. During regeneration phase CK=low the latch needs R281 as a load, in order to take a hard decision based on the amplified imbalance at the output of preamplifier.

Figure 29:
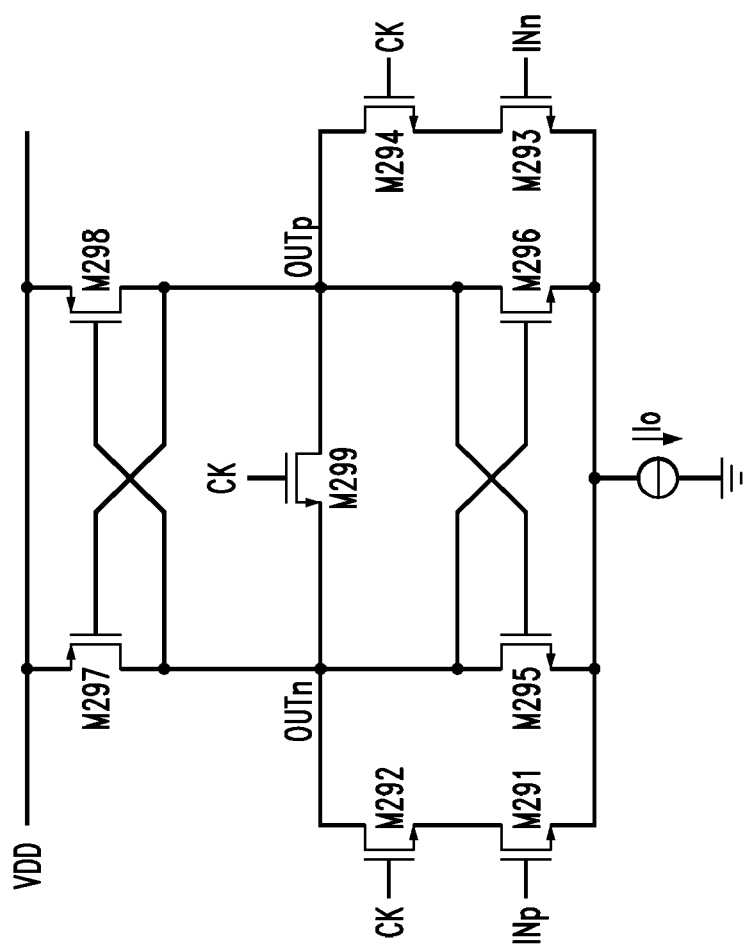

FIG. 29 shows an exemplary implementation of the CML2 latch-comparator with large swing. This embodiment is preferably provided with rail-to-rail CK signals, applied to the gates of M292, M294, and M299. Note that the CK signal in FIG. 29 is the same CK signal as in FIG. 28. The positive and negative inputs are applied to the gates of M291 and M293, respectively, and the outputs taken on the drains of M292 and M294 (which are coupled, respectively, to the drain of M297, the source of M299, and the drain of M295; and to the drain of M298, the drain of M299, and the drain of M296). This design is capable of directly driving a CMOS rail-to-rail latch for differential to single-ended conversion.

Figure 30:
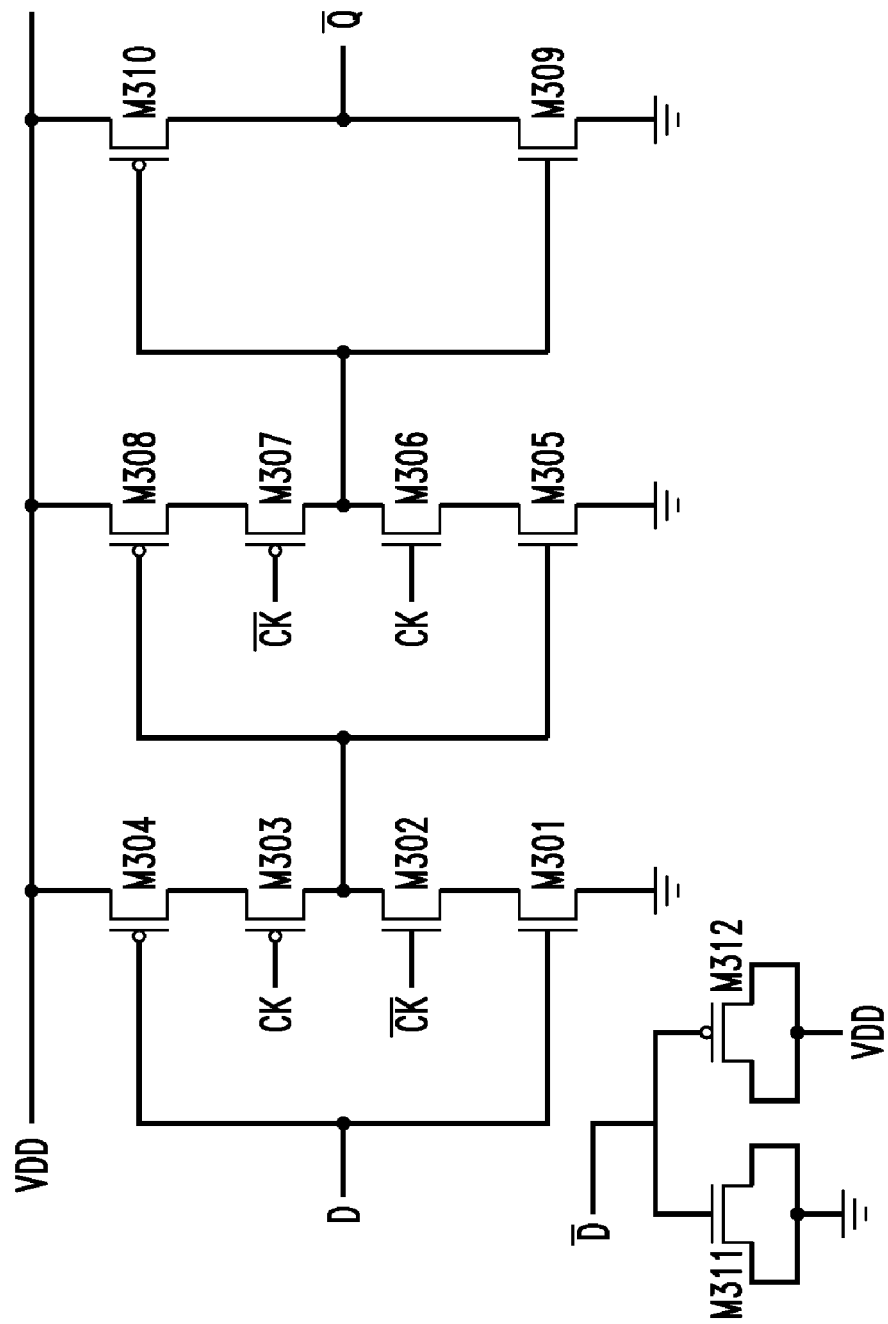

FIG. 30 shows an exemplary implementation of such a CMOS stage (third latch—a CMOS latch with dummy input). It performs differential to single-ended conversion and includes two anti-phase clocked inverters (first inverter including M301-M304 and second inverter including M305-M308) and a final buffer (M309 and M310). M311 and M312 are a dummy load present at the output of D bar such that the parasitic capacitance at D and D bar output will match. OUTn and OUTp from FIG. 29 go to DBAR and D in FIG. 30, respectively.

Figure 31:
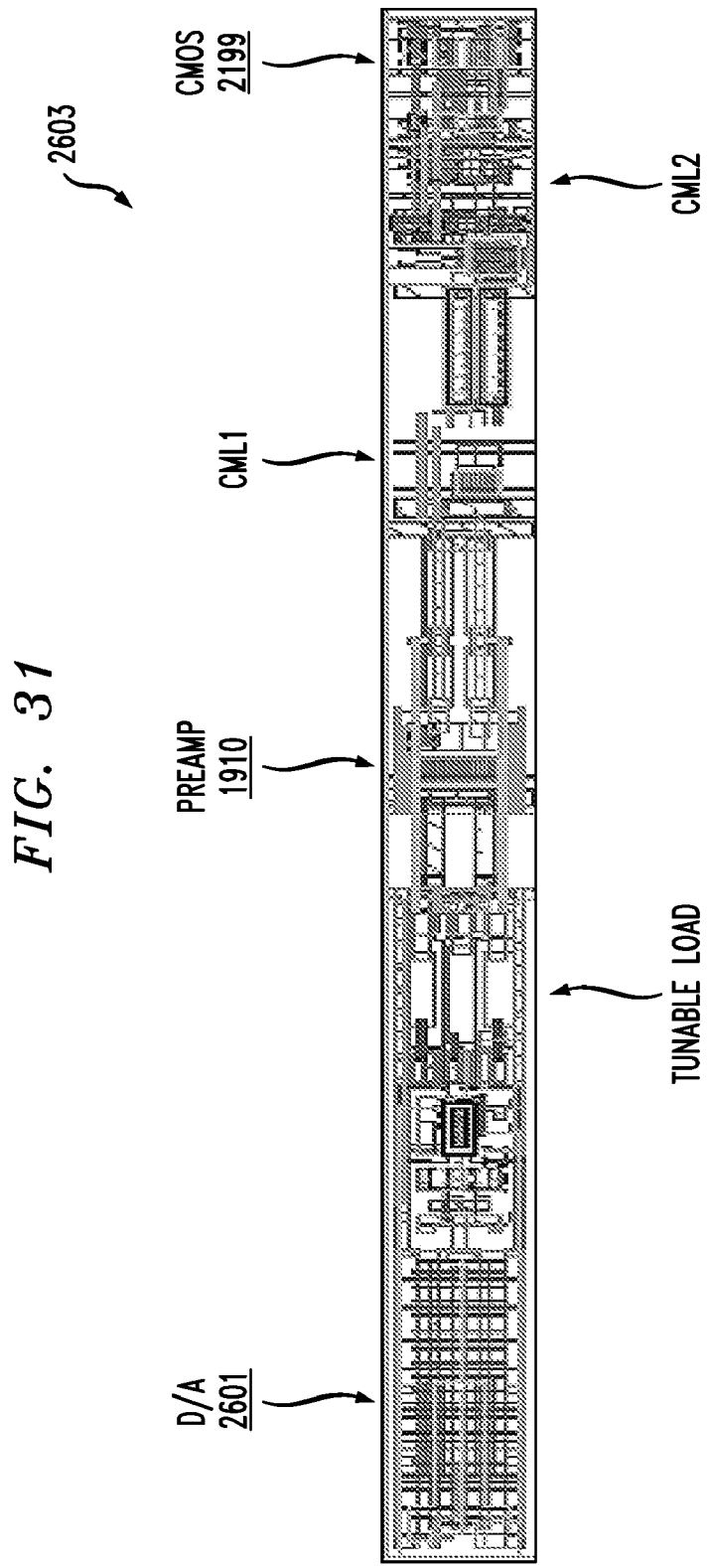
FIG. 31 shows exemplary slice calibration, according to an aspect of the invention.
Figure 32:
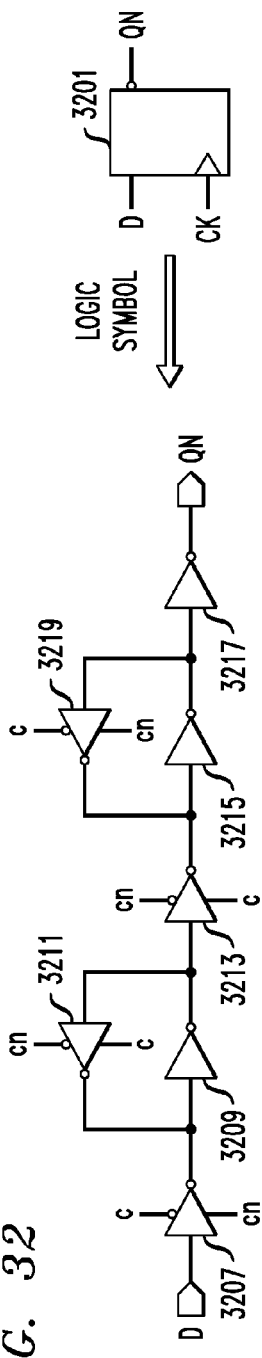
FIG. 32 shows an exemplary shift register, according to an aspect of the invention.
Figure 32:
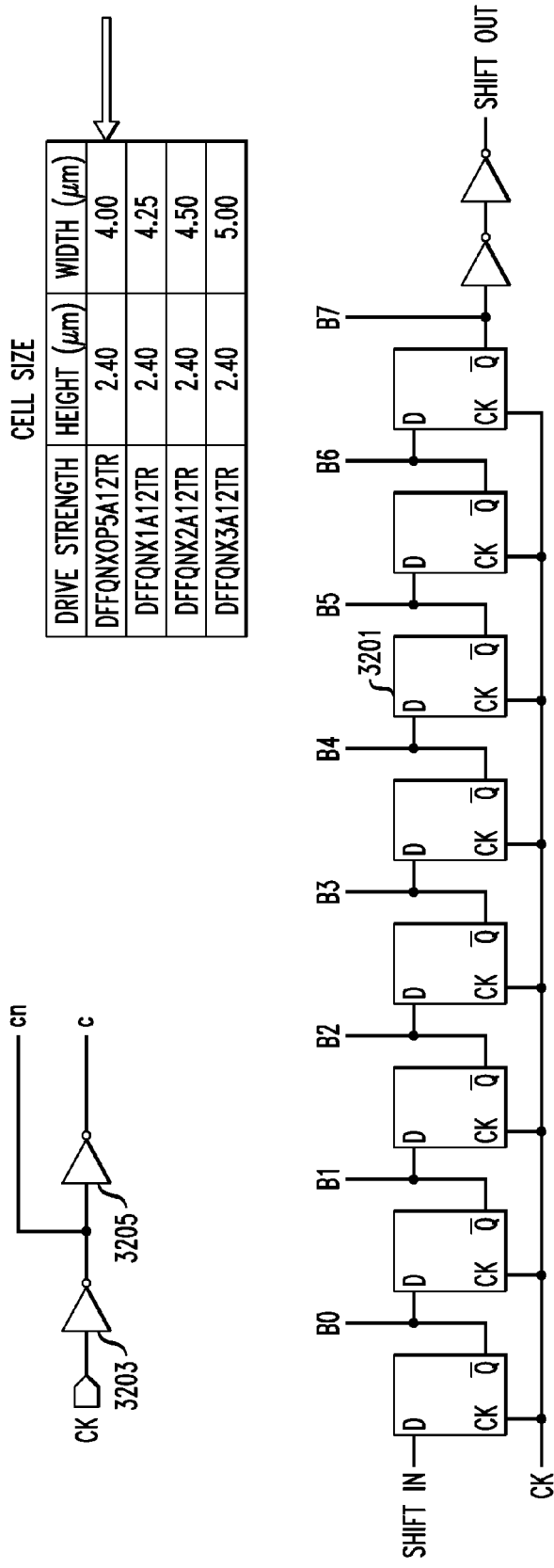

FIG. 31 shows an exemplary compact realization. Local memory is preferably provided for calibration, and the memory registers should preferably fit in the SLICE. The function of R10 and R20 was described above in the context of FIG. 22. The load with R10, R20, R30 together with the selection signals (SEL and SEL bar) and their switches can be seen in FIG. 31 as "tunable load." The local memory in FIG. 32 is used to load the state variables for the signals RESET, SEL, B0, B1, ... B7 of the calibration DA and keep those values constant after calibration. Note that the local memory is not yet present in FIG. 32 but can be seen in FIGS. 33 and 34 and the way it is connected to the slices 2603.

FIG. 32 shows calibration of the D/A converter using a generic shift register including a plurality of positive-edge triggered static-D flip-flops 3201. Such devices may have a width, in some embodiments, of, for example, 4.00 microns. An inverting output with no reset is provided in this instance. In some cases, there may be insufficient room for a second shift register with a latching function. The flip-flops 3201 may be implemented as shown, for example. Input D is fed to the input of clocked inverter 3207, the output of which is fed to the input of inverter 3209, the output of which is fed to the input of clocked inverter 3213, the output of which is fed to the input of inverter 3215, the output of which is fed to the input of inverter 3217, the output of which is QN. The outputs of inverters 3209, 3215 are also tied to the inputs of clocked inverters 3211, 3219, respectively, while the outputs of clocked inverters 3211, 3219 are fed to the inputs of inverters 3209, 3213, respectively. The clocked inverters are controlled by signals c and cn, generated from CK using inverters 3203, 3205.

Figure 33:
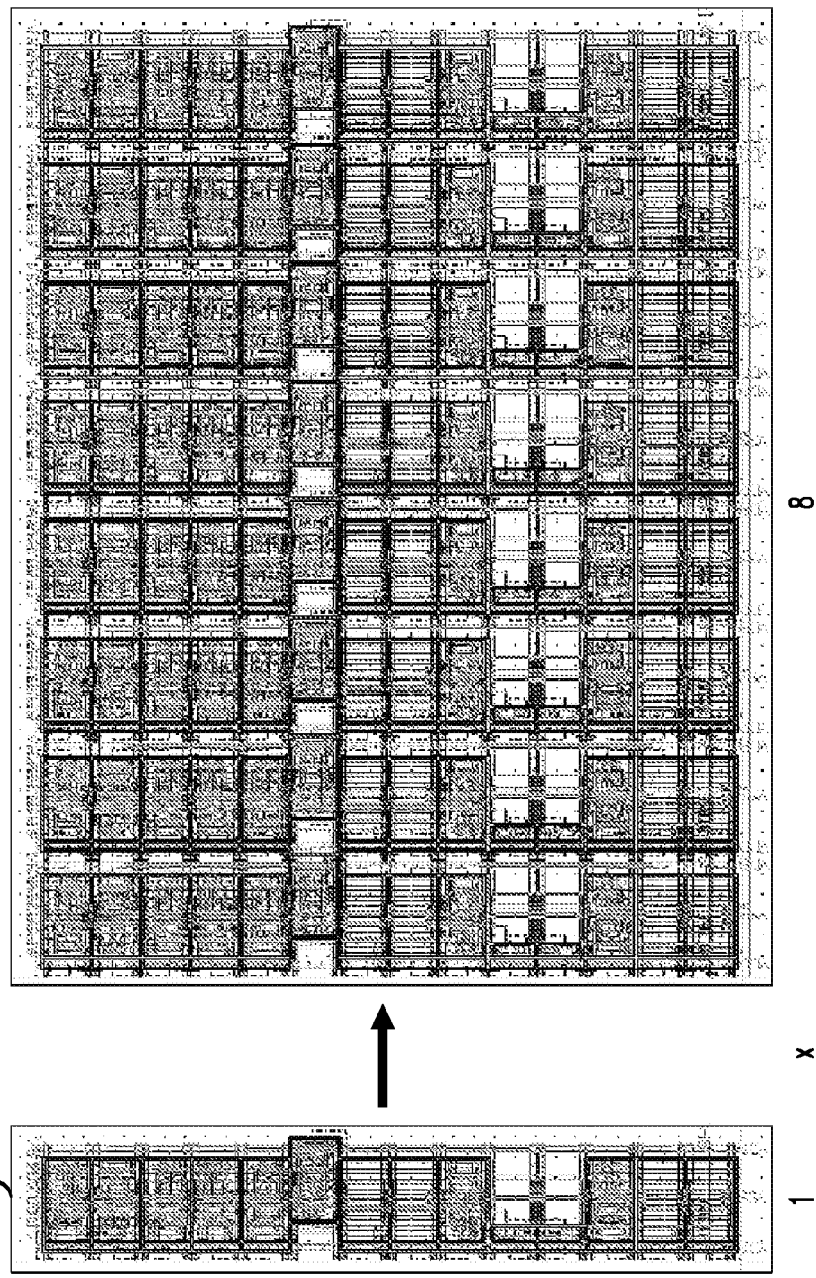
FIGS. 33-35 show various aspects of larger-scale layouts.
Figure 34:
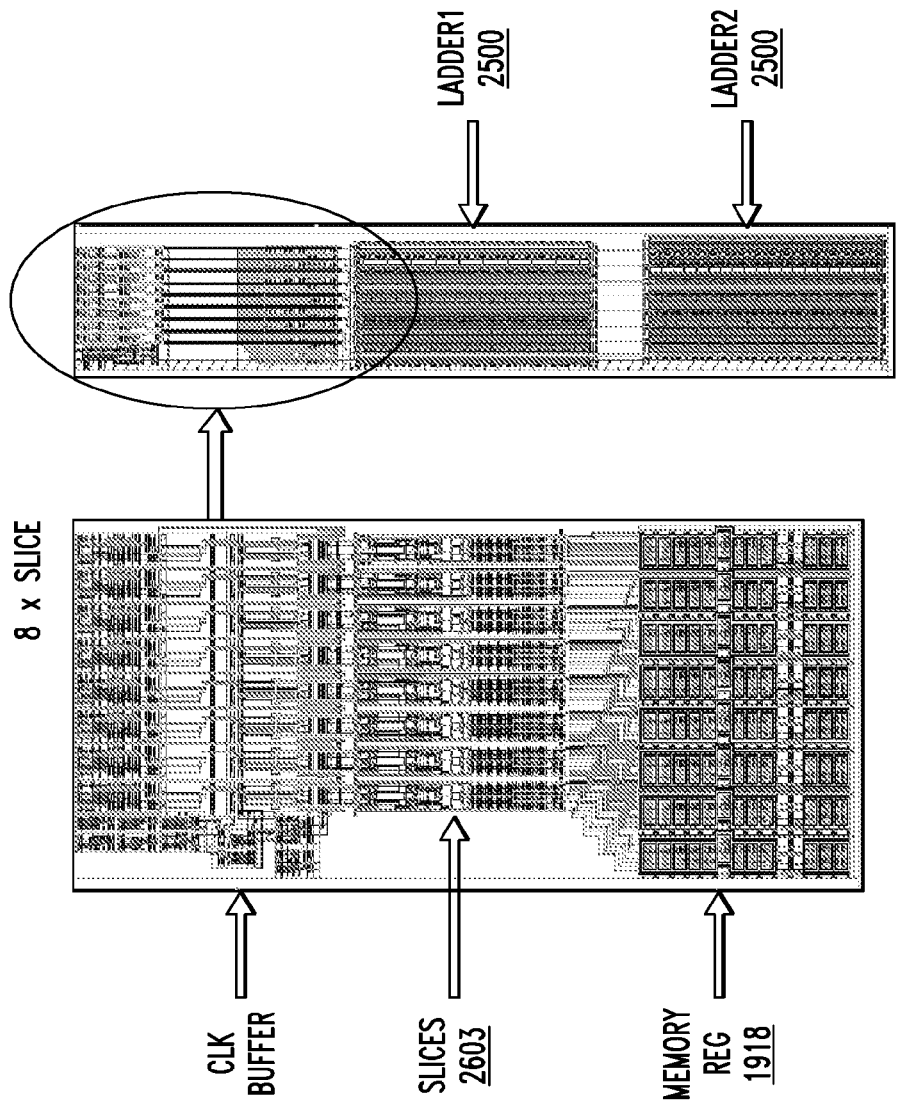
Figure 35:
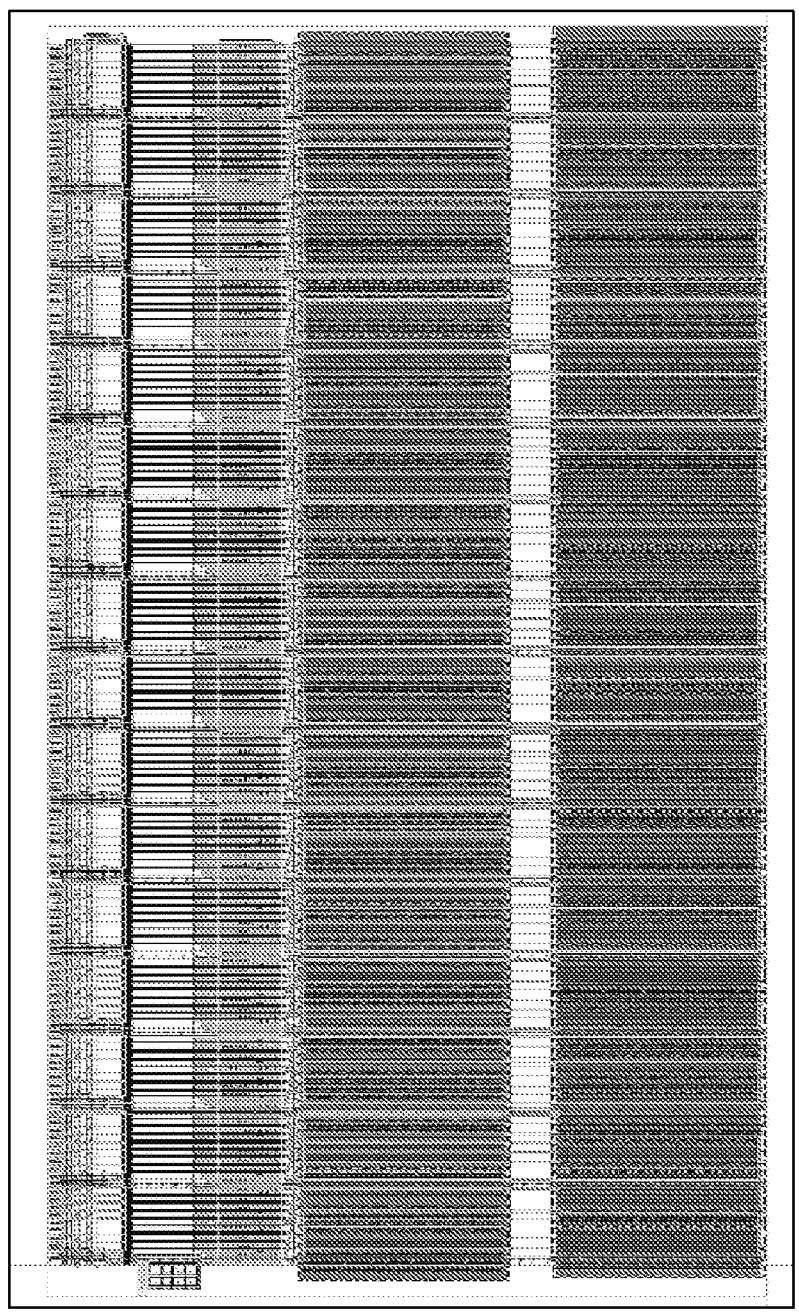

FIG. 33 depicts eight registers 1918 collocated together (these are same as registers 1918 in FIG. 19). FIG. 34 shows eight collocated slices. Note that Ladder 1 and Ladder 2 are each preferably in the form of the DAC circuit 2500 shown in FIG. 25. The memory registers are clocked from a serial interface present on chip. FIG. 35 shows 128 collocated slices.

FIGS. 36-45 show non-limiting exemplary performance simulations.

Figure 36:
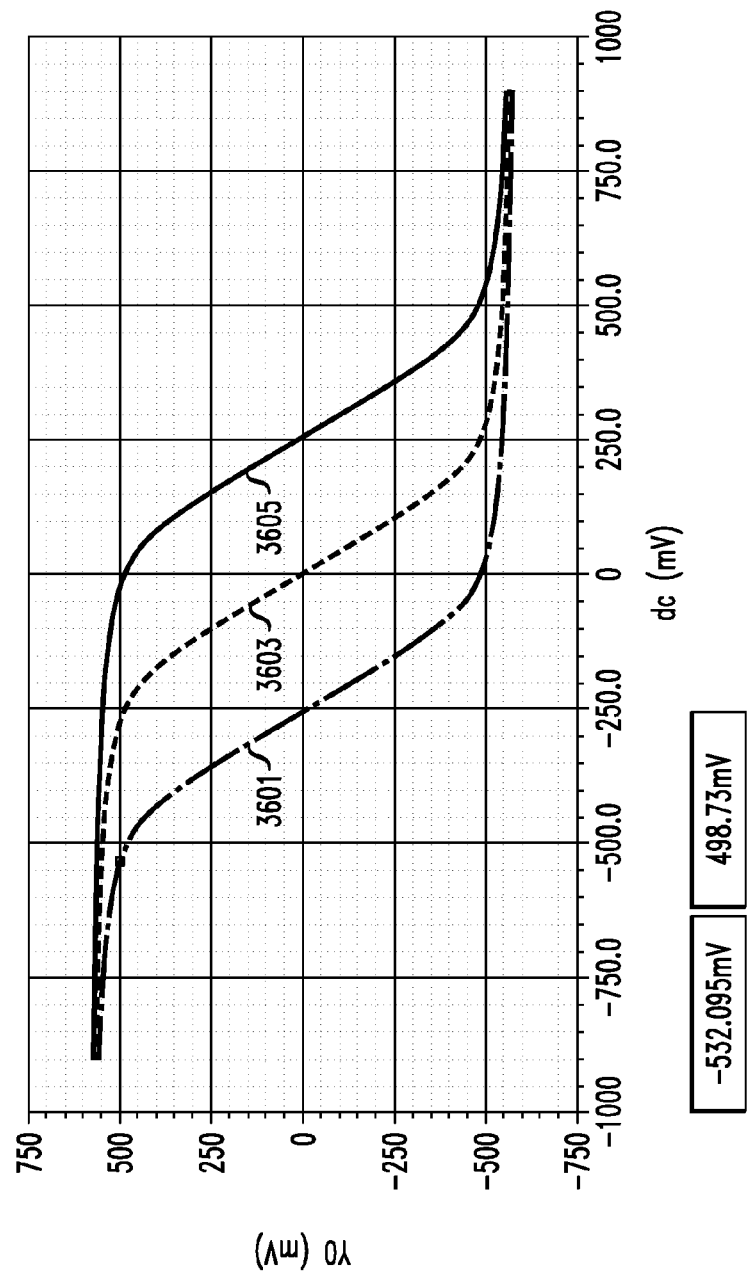
FIGS. 36-45 depict non-limiting exemplary simulated digital calibration.

FIG. 36 represents the input/output voltage transfer for three offset voltages applied at the input of the preamplifier: 3603 is a nominal transfer when VOFFSET=0, 3601 represents the situation VOFFSET=−250 mV, 3602 represents the situation VOFFSET=+250 mV.

Figure 37:
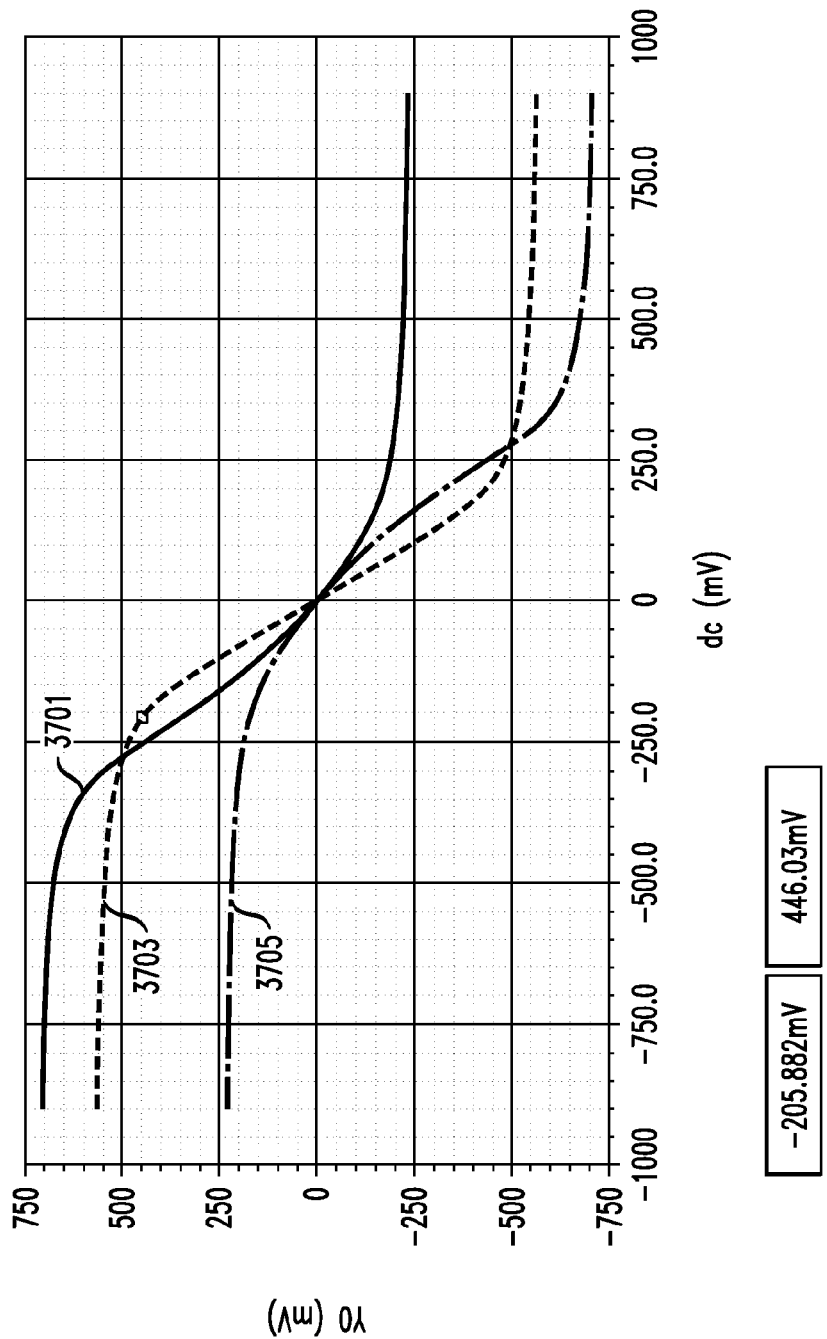

FIG. 37 shows how the D/A at the FS can correct the +/−250 mV offset at the input. By correcting the offset, the common-mode voltage at the output varies as well with the correction (see FIG. 37). Therefore, a differential output swing penalty is noted at the output of the latch (this is an extreme case). The three curves intercept at zero input voltage, 3703 represents the nominal situation without offset, 3701 corresponds to a correction of VOFFSET=−250 mV and 3705 represents the correction for VOFFSET=250 mV.

Figure 38:
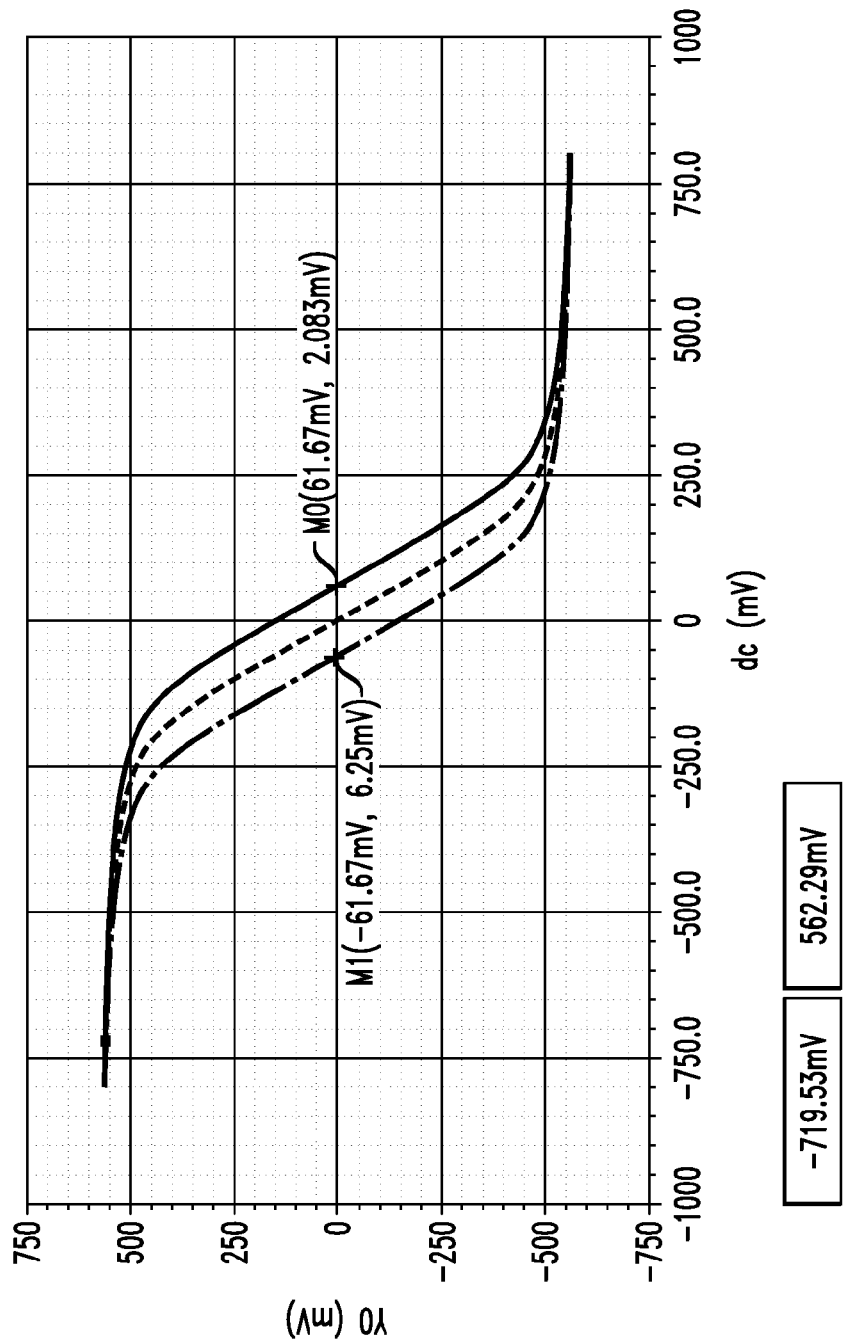

FIG. 38 shows a simulation for $\sigma V_{OS,PREAMP}$=60 mV. This value is the standard deviation of the offset voltage related to the input of the preamplifier. The leftmost curve is for M1 (−61.67 mV, 6.25 mV) and the right curve is for M0 (61.67 mV, 2.083 mV). The middle curve corresponds to nominal condition without offset.

Figure 39:
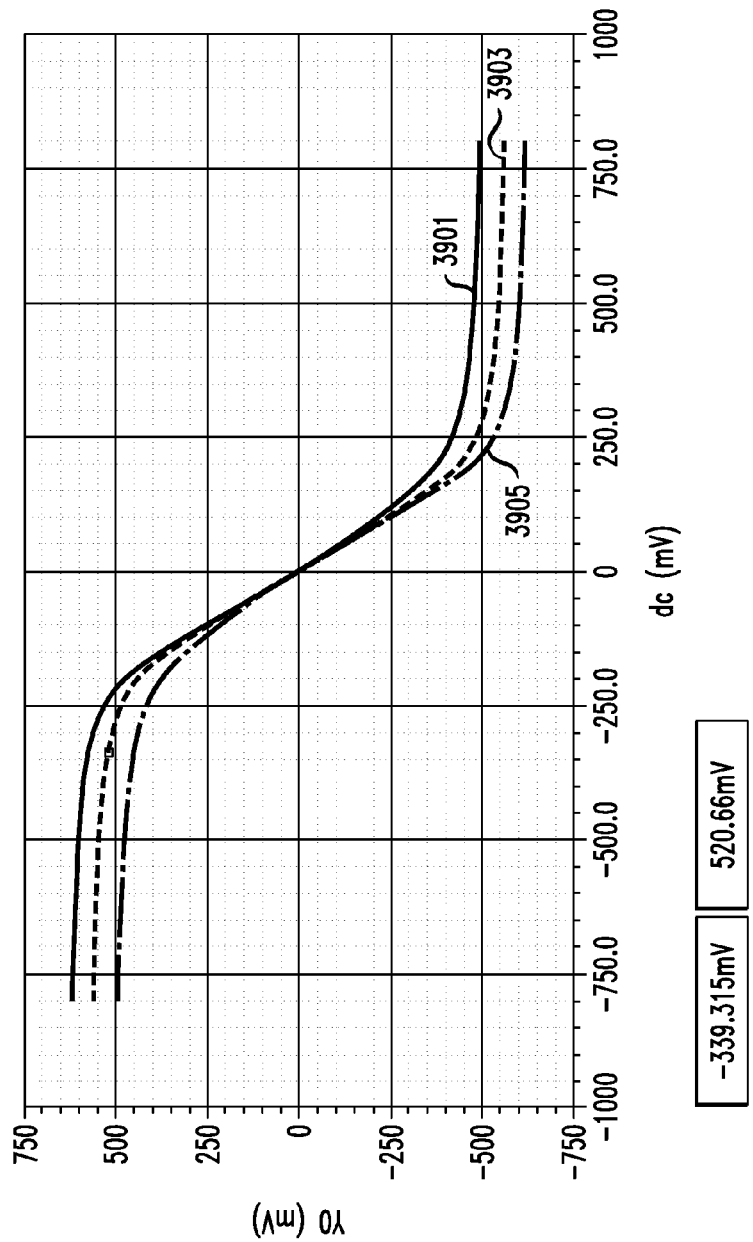

FIG. 39 shows the output swing for +/−500 mV as a function of input variation. As the offset does not have extreme values, the variation of the output common-mode with the offset correction is of a lesser importance. The three curves intercept at zero input voltage, 3903 represents the nominal situation without offset, 3901 corresponds to a correction of VOFFSET=−61.67 mV and 3905 represents the correction for VOFFSET=61.67 mV.

Figure 40:
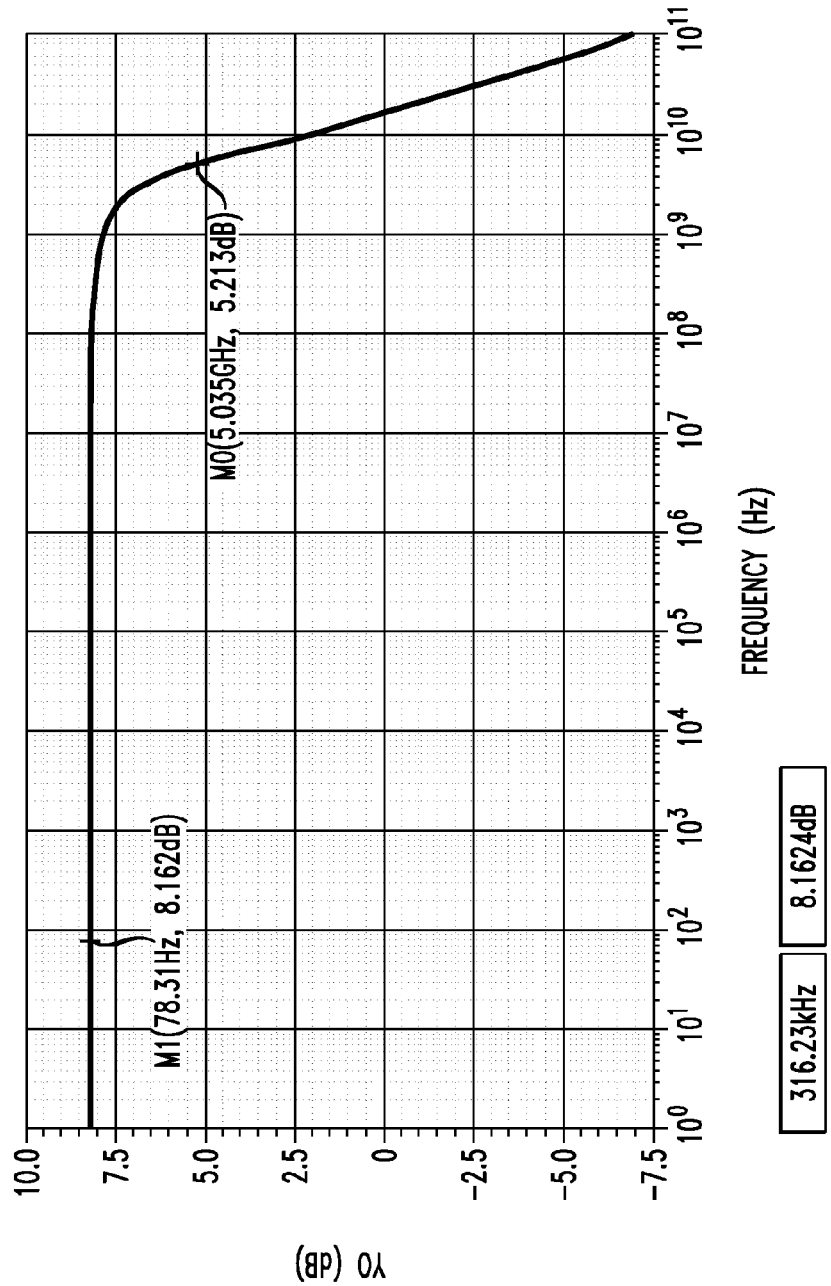

FIG. 40 illustrates that the offset correction circuit has little impact on the bandwidth of the preamp.

Figure 41:
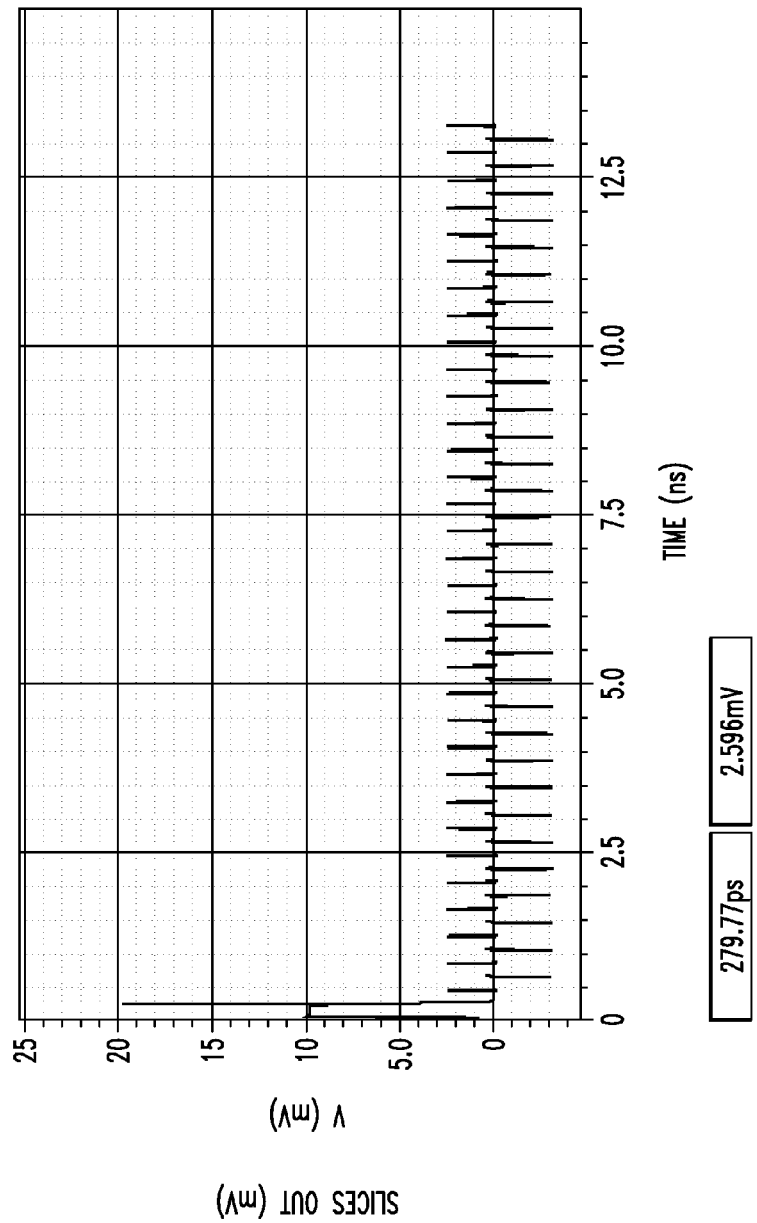

FIG. 41 plots the output voltage of the SLICEs as a function of time to illustrate the impact of offset before calibration (+/−250 mV offset at the preamp inputs). With an up/down ramp, none of the comparators are triggered.

Figure 42:
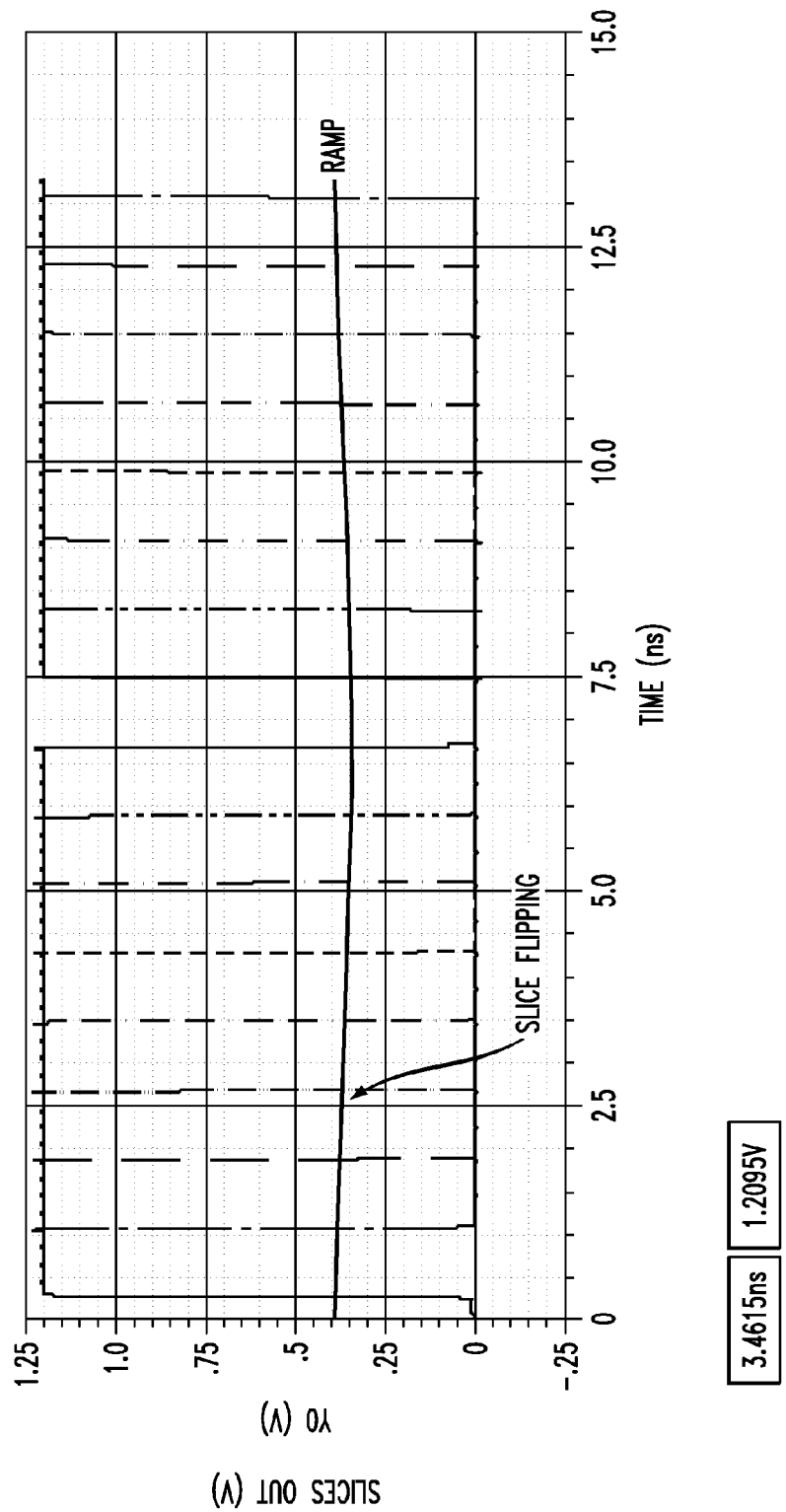

FIG. 42 plots the output voltage of the SLICEs as a function of time to illustrate the impact of offset after calibration such that all of the comparators flip at the right point when a ramp up and down is applied.

Figure 43:
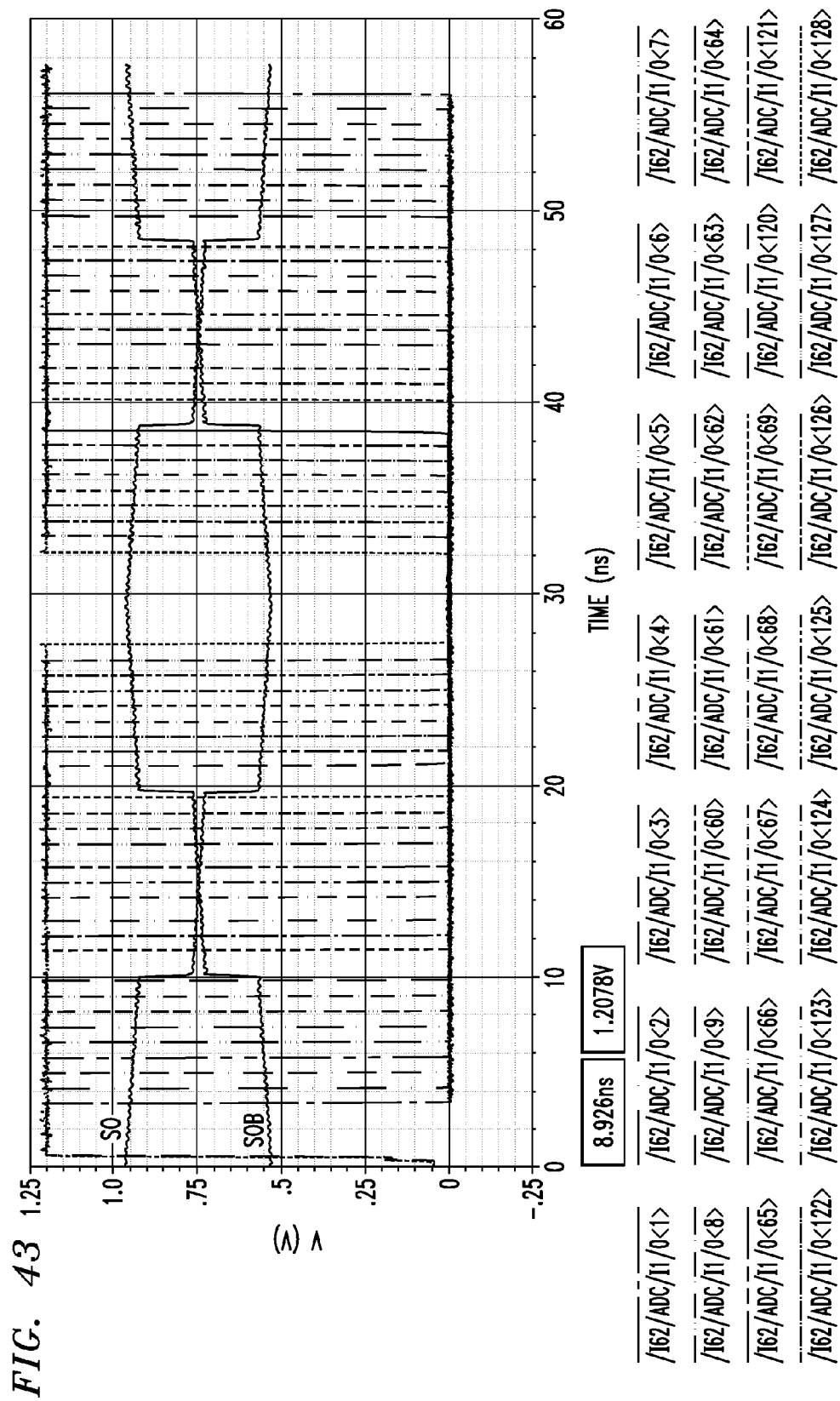

FIG. 43 shows pad-to-pad transistor level 7 bit ADC schematic functional verification of slices with a triple ramp. The 9 top slices, 10 middle slices, and 9 low slices were verified with a differential up-to-down and down-to-up triple ramp with a slope of 0.5 LSB per clock cycle. All the slices flip correctly in the right order (output was taken between 128 slices output and multiplexer 128:4 input). The total number of devices is 109978.

Figure 44:
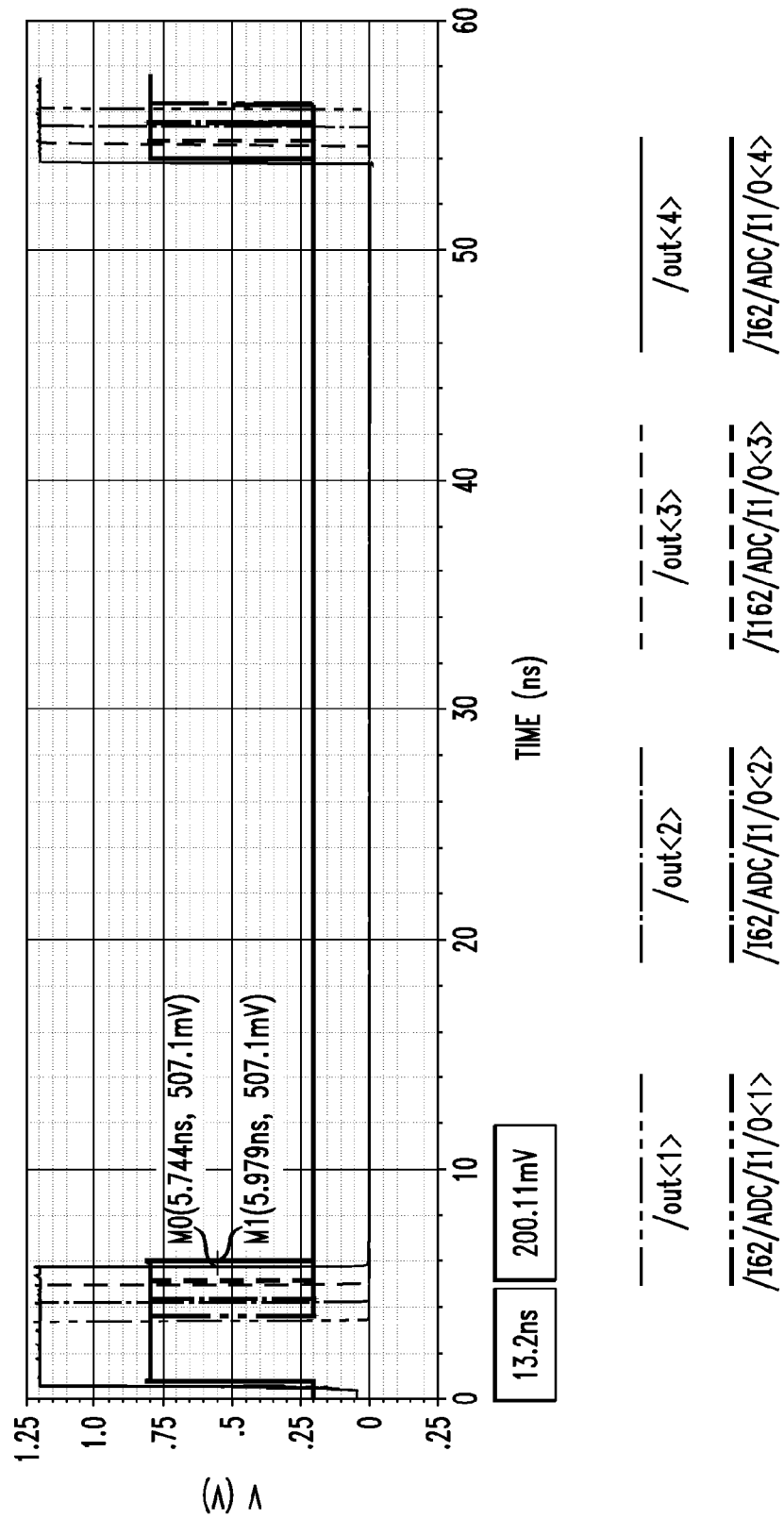

FIG. 44 shows pad-to-pad 7 bit ADC schematic functional verification up to output pads with a triple ramp. Out<1:4> are the macro pad outputs and out<1:4> flip when the slices 1 to 4 flip when the differential up to down and down to up triple ramp with a slop of 0.5 LSB per clock cycle is applied. The mux 128:4 input is properly connected to slices 1 to 4. The estimated delay in the mux and drivers is 235 ps.

Figure 45:
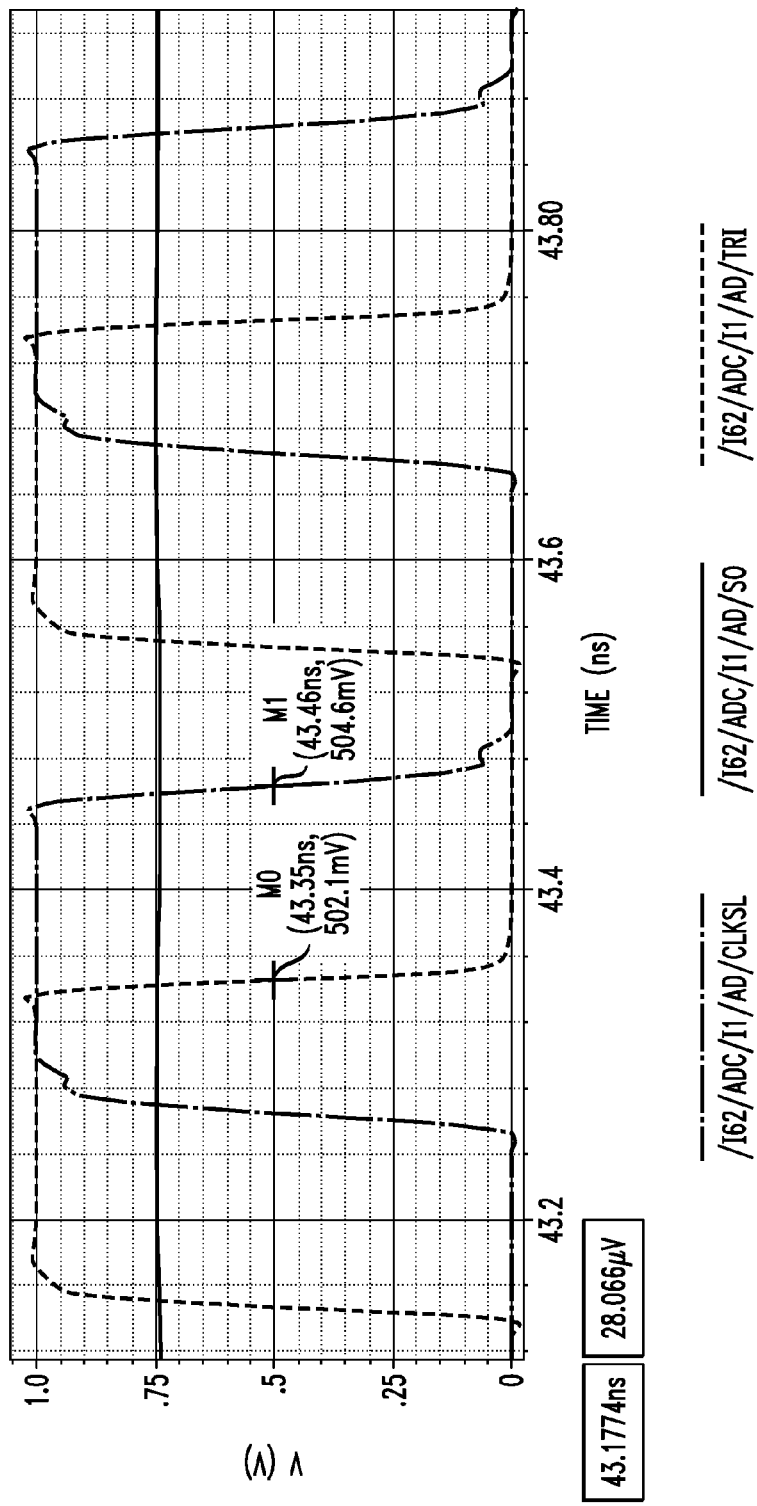

FIG. 45 shows pad-to-pad 7 bit ADC schematic functional verification of timing between hold and latch in the slice. TR1 is the track signal for T/H and CLKSL is the clock for the slice's latch. A delay of 110 ps is noted between TR1 and CLKSL to latch in the middle of the hold.

FIG. 46 summarizes certain significant parameters of the exemplary 7 b ADC. The figure of merit (FOM) is given by:

$$FOM = Power/(fs * 2^{ENOB}) \qquad (10)$$

where fs is the sample frequency of the T/H and ENOB is the effective number of bits.

It is to be emphasized that simulations and parameters are exemplary in nature and not intended to be limiting.

Figure 47:
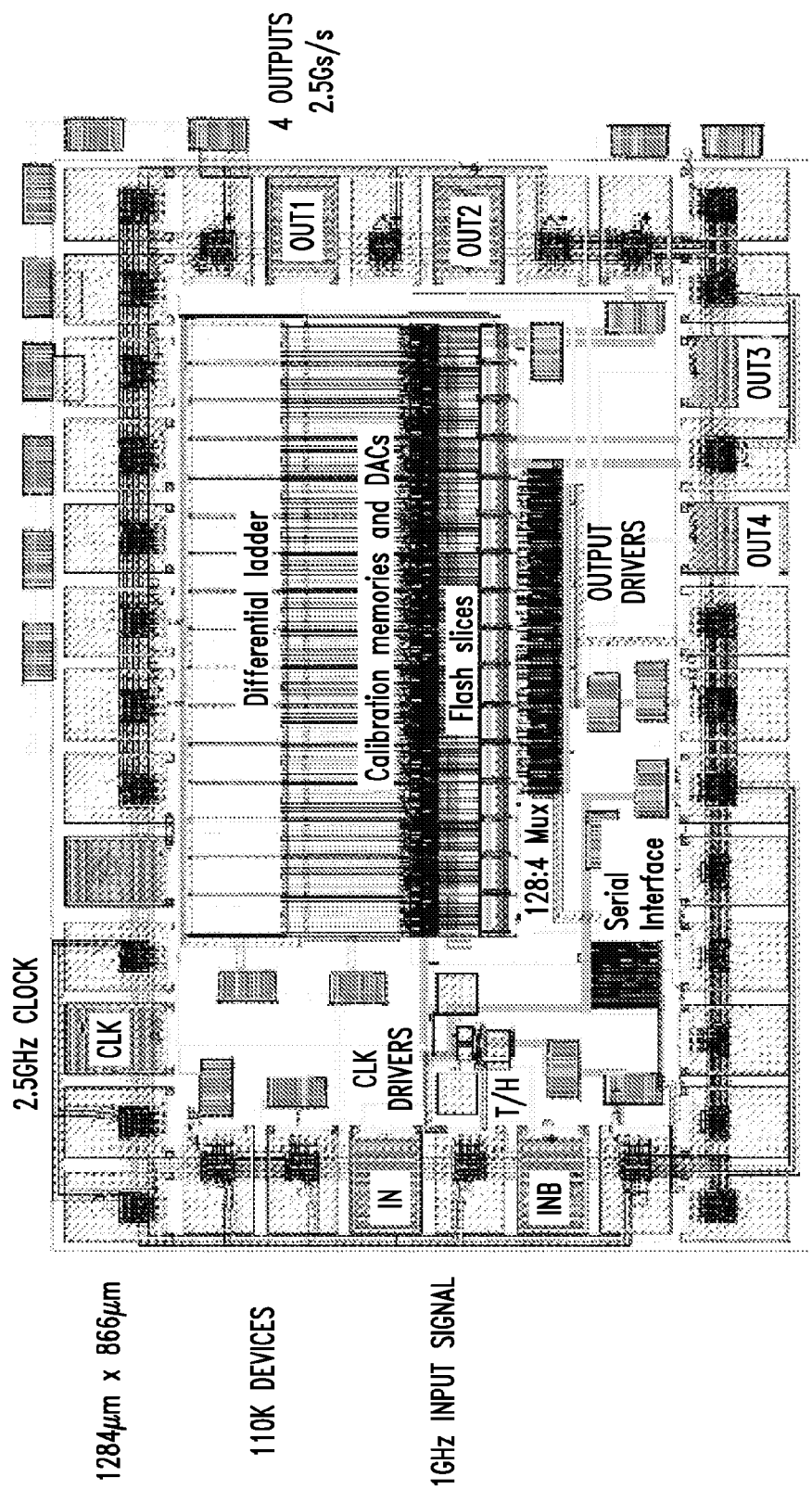
FIG. 47 shows an exemplary macro layout of the exemplary seven-bit binary weighted D/A, according to an aspect of the invention.

FIG. 47 presents an exemplary 7 b ADC macro layout. Four outputs (OUT1-OUT4) are provided at 2.5 Gs/s to measure four contiguous flash slices at a time. Output selection is programmed by the serial interface.

One or more embodiments thus provide a high-speed flash A/D with a calibration D/A and/or a pseudo-differential T/H amplifier. In at least some instances, the D/A is embedded in each slice and has LSB decoupled from the ladder LSB. Each slice is preferably provided with local memory for D/A settings. A minimum size D/A with binary coding can be achieved. The LSB can be adjusted for different accuracy requirements. Compact size can be achieved by abutment. Minimum size devices imply low power and large offset.

One or more instances provide a differential preamp with segmented load and D/A injecting currents in the load, as well as a balanced load. In at least some cases, polarity selection doubles the offset correction range (+/−DAC). A differential ladder can be employed for reference voltages. Three different latches can be provided in each slice, namely, CML1, CML2, and CMOS latch 2199 for metastability mitigation.

Furthermore, one or more embodiments provide a new A/D for applications such as high-speed, medium-high resolution A/D conversion, which can work in modern CMOS processes at low supply voltages (on the order of 1V). The embedded small footprint D/A provides massive calibration, with the slices calibrated sequentially. Massive calibration implies minimum size devices with low power consumption, and the D/A LSB can be adjusted for accuracy or speed.

Given the discussion thus far, it will be appreciated that, in general terms, an exemplary differential track and hold amplifier (see, e.g., FIG. 13), according to an aspect of the invention, includes a track stage comprising first and second linearized pairs connected in series at their respective inputs and in parallel at their respective outputs. A non-limiting example is shown in FIG. 13 where M1, M2, and M3 are connected in parallel with M1', M2', and M3' at the outputs (M1 and M1' both have drains coupled to sources of M4, M5; M3 and M3' both have drains coupled to sources of M6, M7). Furthermore, M1, M2, and M3 are connected in series with M1', M2', and M3' at the inputs (gates of M3 and M1' interconnected to form VCM node).

Also included in the exemplary differential track and hold amplifier is a hold stage (see. e.g., details in FIG. 9) selectively coupled to the outputs of the first and second linearized pairs. The hold stage includes a unity gain buffer with feedback, having a hold capacitor $C_H$ interconnected across its outputs. Note that the inputs of the hold stage (gates of M8 and M12) can be coupled to the drains of M5 and M6 during track mode.

The exemplary differential track and hold amplifier also includes an output buffer coupled to the outputs of the hold stage. In FIG. 13, see, e.g., the plates of $C_H$ tied to the gates of M25 and M26 (forming inputs of the output buffer including M21 through M26.

In an optional but preferred approach, a dummy load arrangement is included, and the outputs of the first and second linearized pairs are selectively coupled to the hold stage in the track mode and to the dummy load arrangement in the hold mode (with M4 and M7 turned on). Furthermore, in an optional but preferred approach, a switching arrangement is provided to float the hold capacitor in the hold mode (note, e.g., hold signal on gates of M10 and M14).

In at least some instances, the first and second linearized pairs each include a first field effect transistor (M2, M2') interconnected between a supply voltage (VDD) and a current source (I0) and having a gate, a drain, and a source. Also included are a pair of variable resistances (R1/4 with switches Bo, B1, B2) coupled to the supply voltage, a pair of resistors Rx, and second (M1, M1') and third (M3, M3') field effect transistors interconnected between the pair of variable resistances and the current source and each having a gate, a drain, and a source. The gates of the second and third field effect transistors being coupled to the gate of the first field effect transistor through the pair of resistors Rx. The first field effect transistor has a device width N at least twice the device width of the second and third field effect transistors. The gate of the third field effect transistor of the first linearized pair M3 is coupled to the gate of the second field effect transistor of the second linearized pair M1' to form a common mode input terminal VCM. The gate of the second field effect transistor of the first linearized pair comprises the input thereof (IN+). The gate of the third field effect transistor of the second linearized pair comprises the input thereof (IN−). The drains of the second and third field effect transistors of the first linearized pair comprise the outputs thereof (coupled to sources of M4, M5 and M6, M&, respectively). The drains of the second and third field effect transistors of the second linearized pair comprise the outputs thereof (coupled to sources of M4, M5 and M6, M&, respectively).

In at least some cases, a control arrangement is provided (e.g., switches B0-B2 with suitable control) to control resistance of the variable resistances to provide automatic gain control.

As best seen in FIG. 7, in some instances, the gate of the third field effect transistor of the first linearized pair M3 and the gate of the second field effect transistor of the second linearized pair M1' are configured to be selectively decoupled in a calibration mode so that the gate of the second field effect transistor of the first linearized pair and the gate of the third field effect transistor of the first linearized pair form differential inputs of the first linearized pair (IN1+, IN1−) and the gate of the second field effect transistor of the second linearized pair and the gate of the third field effect transistor of the second linearized pair form differential inputs of the second linearized pair (IN2+, IN2−).

In another aspect, an exemplary analog-to-digital converter (e.g., 1900 in FIG. 19; see also FIG. 21) includes a differential track-and-hold amplifier 1902, a voltage ladder 1906, and a plurality of slices. Each slice includes a differential preamplifier 1910 coupled to the track-and-hold amplifier and to a corresponding location on the voltage ladder; a current mode logic latch comparator CML1 coupled to the differential preamplifier; a large-swing latch CML2 coupled to the current mode logic latch comparator; a complementary metal oxide semiconductor latch 2199 having a dummy load; a calibration digital to analog converter 1916 connected across outputs of the differential preamplifier to inject calibration currents; and a register 1918 coupled to the calibration digital to analog converter and storing calibration values for use thereby. Also included is a multiplexer 1914 which multiplexes outputs of the complementary metal oxide semiconductor latches down to a predetermined number of outputs (e.g., OUT1-OUT4).

In at least some instances, a serial interface 1920 is coupled to the registers for programming the calibration digital-to-analog converters. In a non-limiting example, there are one hundred twenty eight of the slices and the predetermined number of outputs comprises four outputs, so that the multiplexer is a 128:4 multiplexer.

Figure 23:
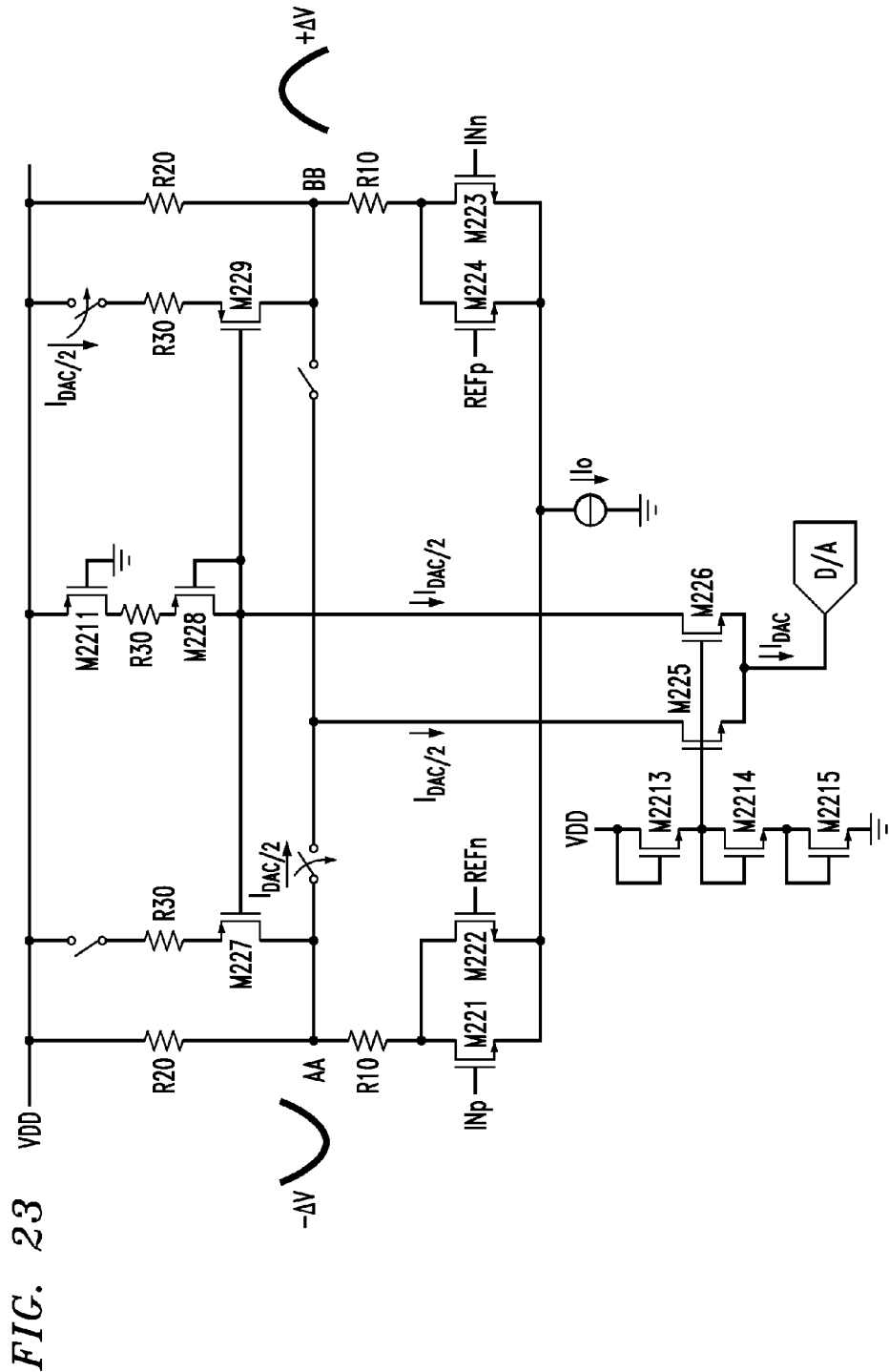
Figure 24:
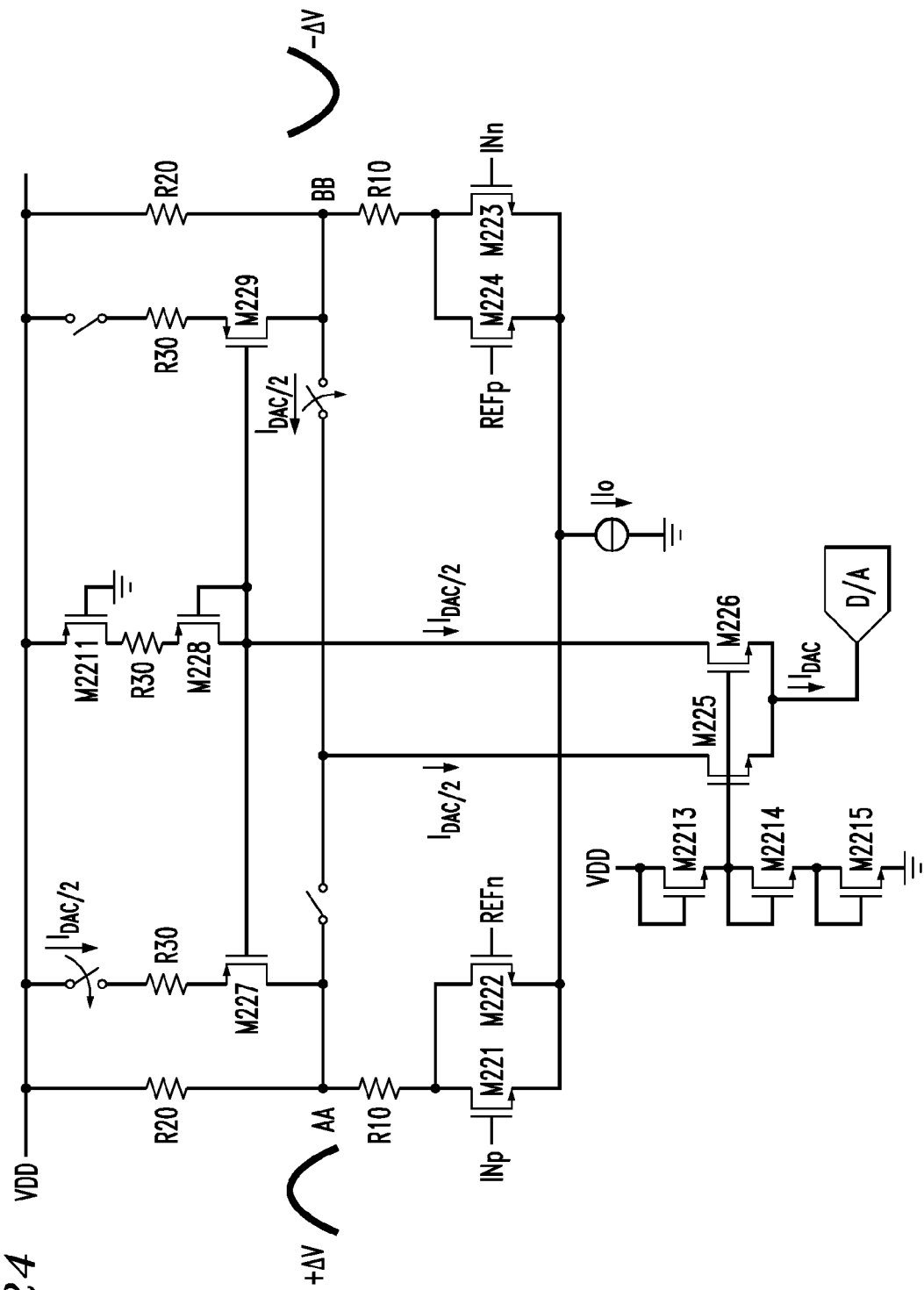

As best seen in FIGS. 22-24, in at least some cases, the differential preamplifiers include segmented loads R10, R20.

As discussed in connection with FIG. 26, in some cases, the calibration digital to analog converters are implemented using abutment.

In one or more embodiments, the calibration digital to analog converters are binary weighted digital to analog converters not employing thermometer code.

Advantageously, the calibration digital to analog converters 1916 have least significant bits that are selectively changeable and decoupled from the least significant bit of the voltage ladder 1906.

As best seen in FIG. 28, in some cases, the current mode logic latch comparator CML1 includes first and second field effect transistors M281, M282 arranged as a first differential pair, clocked with a clock signal, each having a gate, a drain, and a source, having their gates as differential input terminals INp, INn coupled to the differential preamplifier, and having their drains as differential output terminals OUTn, OUTp. Also included are third and fourth field effect transistors M283, M284, clocked with the complement of the clock signal, each having a gate, a drain, and a source, and arranged in parallel with the first and second field effect transistors. The third field effect transistor has its gate coupled to the drain of the fourth field effect transistor, and the fourth field effect transistor has its gate coupled to the drain of the third field effect transistor.

As best seen in FIG. 29, in one or more embodiments, the large-swing latch CML2 includes fifth, sixth, seventh, eighth, ninth, tenth, eleventh, twelfth, and thirteenth field effect transistors (e.g., M291-M299), each having a gate, a drain, and a source; a supply voltage rail VDD; and a current source I0. The fifth field effect M291 transistor is n-type, has its source connected to the current source, and has its gate as a differential input terminal INp coupled to one of the differential output terminals of the current mode logic latch comparator. The sixth field effect M292 transistor is n-type, has its source connected to the drain of the fifth field effect transistor, and has a clock signal applied to its gate. The eighth field effect transistor M293 is n-type, has its source connected to the current source, and has its gate as a differential input terminal INn coupled to another one of the differential output terminals of the current mode logic latch comparator. The ninth field effect transistor M294 is n-type, has its source connected to the drain of the fifth field effect transistor, and has a clock signal applied to its gate. The eleventh field effect transistor M297 is p-type, has its source connected to the supply voltage rail, and has its drain connected to the drain of the sixth field effect transistor to form a first differential output terminal OUTn. The seventh field effect transistor M295 is n-type, has its source connected to the current source, and has its drain connected to the first differential output terminal. The twelfth field effect transistor M298 is p-type, has its source connected to the supply voltage rail, and has its drain connected to the drain of the ninth field effect transistor to form a second differential output terminal OUTp. The tenth field effect transistor M296 is n-type, has its source connected to the current source, and has its drain connected to the second differential output terminal. The thirteenth field effect transistor M299 is n-type, has the clock signal applied to its gate, has its source connected to the first differential output terminal, and has its drain connected to the second differential output terminal.

The gate of the eleventh field effect transistor is coupled to the drain of the twelfth field effect transistor. The gate of the twelfth field effect transistor is coupled to the drain of the eleventh field effect transistor. The gate of the seventh field effect transistor is coupled to the drain of the tenth field effect transistor. The gate of the tenth field effect transistor is coupled to the drain of the seventh field effect transistor.

As best seen in FIG. 30, in some cases, the complementary metal oxide semiconductor latch 2199 includes a first anti-phase clocked inverter including M301-M304; a second anti-phase clocked inverter including M305-M308 coupled to the first anti-phase clocked inverter; a buffer including M309, M310 coupled to the second anti-phase clocked inverter; and a dummy load including M311 and M312 present at the output of D bar such that the parasitic capacitance at D and D bar output will match. It is to be noted that DBAR and D in FIG. 30 are respectively coupled to OUTn and OUTp in FIG. 29.

Integrated circuit chips in accordance with one or more embodiments of the invention can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, such as, by way of example and not limitation, a communications circuit or the like.

Figure 48:
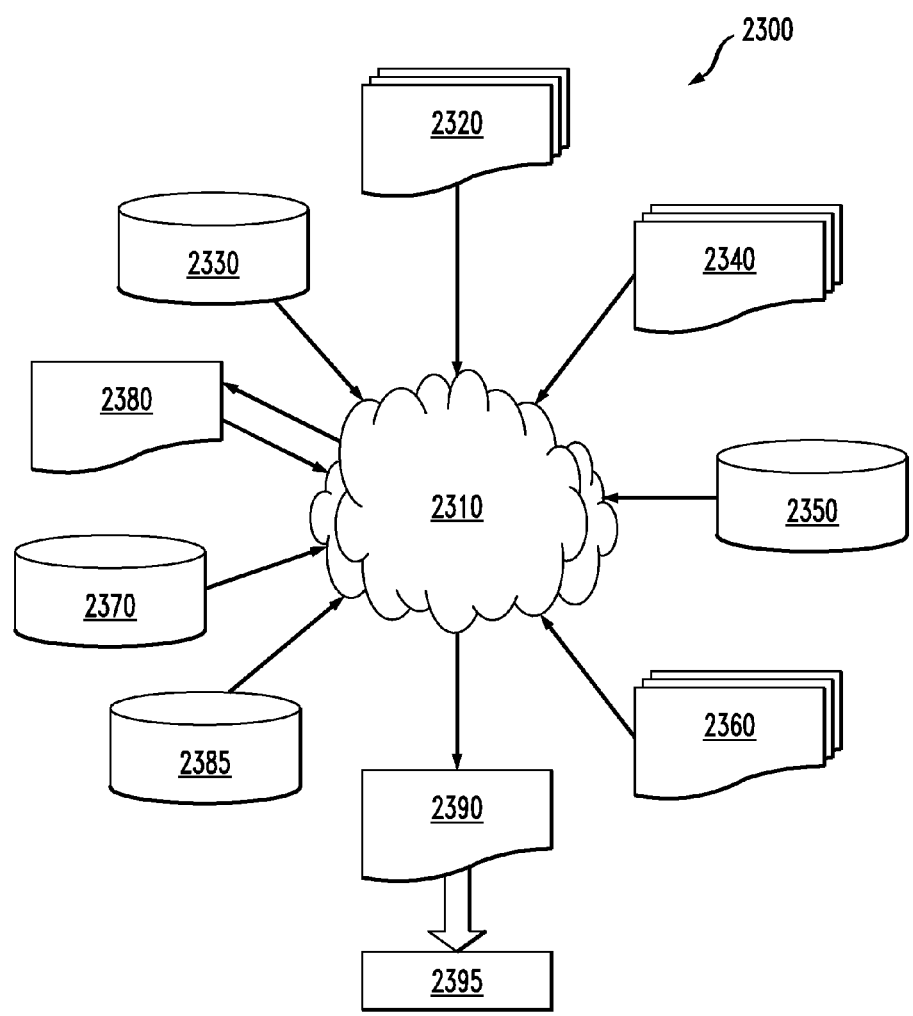
FIG. 48 is a flow diagram of a design process used in semiconductor design, manufacture, and/or test.

FIG. 48 shows a block diagram of an exemplary design flow 2300 used for example, in semiconductor IC logic design, simulation, test, layout, and manufacture. Design flow 2300 includes processes, machines and/or mechanisms for processing design structures or devices to generate logically or otherwise functionally equivalent representations of the design structures and/or devices described above and shown in FIGS. 1-4, 7-14, 19-35, and 47. The design structures processed and/or generated by design flow 2300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array). Design flow 2300 may vary depending on the type of representation being designed. For example, a design flow 2300 for building an application specific IC (ASIC) may differ from a design flow 2300 for designing a standard component or from a design flow 2300 for instantiating the design into a programmable array, for example a programmable gate array (PGA) or a field programmable gate array (FPGA) offered by Altera® Inc. or Xilinx® Inc. FIG. 23 illustrates multiple such design structures including an input design structure 2320 that is preferably processed by a design process 2310. Design structure 2320 may be a logical simulation design structure generated and processed by design process 2310 to produce a logically equivalent functional representation of a hardware device. Design structure 2320 may also or alternatively comprise data and/or program instructions that when processed by design process 2310, generate a functional representation of the physical structure of a hardware device. Whether representing functional and/or structural design features, design structure 2320 may be generated using electronic computer-aided design (ECAD) such as implemented by a core developer/designer. When encoded on a machine-readable data transmission, gate array, or storage medium, design structure 2320 may be accessed and processed by one or more hardware and/or software modules within design process 2310 to simulate or otherwise functionally represent an electronic component, circuit, electronic or logic module, apparatus, device, or system such as those shown in FIGS. 1-4, 7-14, 19-35, and 47. As such, design structure 2320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++. Design process 2310 preferably employs and incorporates hardware and/or software modules for synthesizing, translating, or otherwise processing a design/simulation functional equivalent of the components, circuits, devices, or logic structures shown in FIGS. 1-4, 7-14, 19-35, and 47 to generate a netlist 2380 which may contain design structures such as design structure 2320. Netlist 2380 may comprise, for example, compiled or otherwise processed data structures representing a list of wires, discrete components, logic gates, control circuits, I/O devices, models, etc. that describes the connections to other elements and circuits in an integrated circuit design. Netlist 2380 may be synthesized using an iterative process in which netlist 2380 is resynthesized one or more times depending on design specifications and parameters for the device. As with other design structure types described herein, netlist 2380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means. Design process 2310 may include hardware and software modules for processing a variety of input data structure types including netlist 2380. Such data structure types may reside, for example, within library elements 2330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 2340, characterization data 2350, verification data 2360, design rules 2370, and test data files 2385 which may include input test patterns, output test results, and other testing information. Design process 2310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 2310 without deviating from the scope and spirit of the invention. Design process 2310 may also include modules for performing standard circuit design processes such as timing analysis, verification, design rule checking, place and route operations, etc. Design process 2310 employs and incorporates logic and physical design tools such as HDL compilers and simulation model build tools to process design structure 2320 together with some or all of the depicted supporting data structures along with any additional mechanical design or data (if applicable), to generate a second design structure 2390. Design structure 2390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 2320, design structure 2390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4, 7-14, 19-35, and 47. In one embodiment, design structure 2390 may comprise a compiled, executable HDL simulation model that functionally simulates the devices shown in FIGS. 1-4, 7-14, 19-35, and 47. Design structure 2390 may also employ a data format used for the exchange of layout data of integrated circuits and/or symbolic data format (e.g. information stored in a GDSII (GDS2), GL1, OASIS, map files, or any other suitable format for storing such design data structures). Design structure 2390 may comprise information such as, for example, symbolic data, map files, test files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4, 7-14, 19-35, and 47. Design structure 2390 may then proceed to a stage 2395 where, for example, design structure 2390: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:
1. A differential track and hold amplifier, comprising:
a track stage comprising first and second linearized pairs connected in series at their respective inputs and in parallel at their respective outputs;
a hold stage selectively coupled to said outputs of said first and second linearized pairs, said hold stage comprising a unity gain buffer with feedback having a hold capacitor interconnected across its outputs; and
an output buffer coupled to said outputs of said hold stage.

2. The amplifier of claim 1, further comprising a dummy load arrangement, wherein said outputs of said first and second linearized pairs are selectively coupled to said hold stage in a track mode and to said dummy load arrangement in said hold mode.

3. The amplifier of claim 2, further comprising a switching arrangement configured to float said hold capacitor in said hold mode.

4. The amplifier of claim 3, wherein:
said first and second linearized pairs each comprise:
a first field effect transistor interconnected between a supply voltage and a current source and having a gate, a drain, and a source;
a pair of variable resistances coupled to said supply voltage;
a pair of resistors; and
second and third field effect transistors interconnected between said pair of variable resistances and said current source and each having a gate, a drain, and a source, said gates of said second and third field effect transistors being coupled to said gate of said first field effect transistor through said pair of resistors, said first field effect transistor having a device width at least twice a device width of said second and third field effect transistors;
said gate of said third field effect transistor of said first linearized pair is coupled to said gate of said second field effect transistor of said second linearized pair to form a common mode input terminal;
said gate of said second field effect transistor of said first linearized pair comprises said input thereof;
said gate of said third field effect transistor of said second linearized pair comprises said input thereof;
said drains of said second and third field effect transistors of said first linearized pair comprise said outputs thereof; and
said drains of said second and third field effect transistors of said second linearized pair comprise said outputs thereof.

5. The amplifier of claim 4, further comprising a control arrangement configured to control resistance of said variable resistances to provide automatic gain control.

6. The amplifier of claim 4, wherein:
said gate of said third field effect transistor of said first linearized pair and said gate of said second field effect transistor of said second linearized pair are configured to be selectively decoupled in a calibration mode so that said gate of said second field effect transistor of said first linearized pair and said gate of said third field effect transistor of said first linearized pair form differential inputs of said first linearized pair and said gate of said second field effect transistor of said second linearized pair and said gate of said third field effect transistor of said second linearized pair form differential inputs of said second linearized pair.

7. An analog-to-digital converter comprising:
a differential track-and-hold amplifier;
a voltage ladder;
a plurality of slices, each of said slices in turn comprising:
a differential preamplifier coupled to said track-and-hold amplifier and to a corresponding location on said voltage ladder;
a current mode logic latch comparator coupled to said differential preamplifier;
a large-swing latch coupled to said current mode logic latch comparator;
a complementary metal oxide semiconductor latch having a dummy load;
a calibration digital to analog converter connected across outputs of said differential preamplifier to inject calibration currents; and
a register coupled to said calibration digital to analog converter and storing calibration values for use thereby;
a multiplexer which multiplexes outputs of said complementary metal oxide semiconductor latches down to a predetermined number of outputs.

8. The analog-to-digital converter of claim 7, further comprising a serial interface coupled to said registers for programming said calibration digital-to-analog converters.

9. The analog-to-digital converter of claim 7, wherein there are one hundred twenty eight of said slices and said predetermined number of outputs comprises four outputs.

10. The analog-to-digital converter of claim 7, wherein said differential preamplifiers comprise segmented loads.

11. The analog-to-digital converter of claim 10, wherein said calibration digital to analog converters are implemented using abutment.

12. The analog-to-digital converter of claim 10, wherein said calibration digital to analog converters comprise binary weighted digital to analog converters not employing thermometer code.

13. The analog-to-digital converter of claim 10, wherein said calibration digital to analog converters have least significant bits that are selectively changeable and decoupled from a least significant bit of said voltage ladder.

14. The analog-to-digital converter of claim 10, wherein said current mode logic latch comparator comprises:
first and second field effect transistors arranged as a first differential pair, clocked with a clock signal, each having a gate, a drain, and a source, having their gates as differential input terminals coupled to said differential preamplifier, and having their drains as differential output terminals;
third and fourth field effect transistors, clocked with a complement of said clock signal, each having a gate, a drain, and a source, and being arranged in parallel with said first and second field effect transistors, said third field effect transistor having its gate coupled to said drain of said fourth field effect transistor, said fourth field effect transistor having its gate coupled to said drain of said third field effect transistor.

15. The analog-to-digital converter of claim 14, wherein said large-swing latch comprises:
fifth, sixth, seventh, eighth, ninth, tenth, eleventh, twelfth, and thirteenth field effect transistors, each having a gate, a drain, and a source;
a supply voltage rail; and
a current source:
wherein:
said fifth field effect transistor is n-type, has its source connected to said current source, and has its gate as a differential input terminal coupled to one of said differential output terminals of said current mode logic latch comparator;
said sixth field effect transistor is n-type, has its source connected to said drain of said fifth field effect transistor, and has a clock signal applied to its gate;
said eighth field effect transistor is n-type, has its source connected to said current source, and has its gate as a differential input terminal coupled to another one of said differential output terminals of said current mode logic latch comparator;

said ninth field effect transistor is n-type, has its source connected to said drain of said fifth field effect transistor, and has a clock signal applied to its gate;

said eleventh field effect transistor is p-type, has its source connected to said supply voltage rail, and has its drain connected to said drain of said sixth field effect transistor to form a first differential output terminal;

said seventh field effect transistor is n-type, has its source connected to said current source, and has its drain connected to said first differential output terminal;

said twelfth field effect transistor is p-type, has its source connected to said supply voltage rail, and has its drain connected to said drain of said ninth field effect transistor to form a second differential output terminal;

said tenth field effect transistor is n-type, has its source connected to said current source, and has its drain connected to said second differential output terminal;

said thirteenth field effect transistor is n-type, has said clock signal applied to its gate, has its source connected to said first differential output terminal, and has its drain connected to said second differential output terminal;

said gate of said eleventh field effect transistor is coupled to said drain of said twelfth field effect transistor;

said gate of said twelfth field effect transistor is coupled to said drain of said eleventh field effect transistor;

said gate of said seventh field effect transistor is coupled to said drain of said tenth field effect transistor; and said gate of said tenth field effect transistor is coupled to said drain of said seventh field effect transistor.

16. The analog-to-digital converter of claim 15, wherein said complementary metal oxide semiconductor latch comprises:

a first anti-phase clocked inverter;

a second anti-phase clocked inverter coupled to said first anti-phase clocked inverter; and a buffer coupled to said second anti-phase clocked inverter.

* * * * *